US012647102B1

(12) United States Patent
Siddiqui et al.

(10) Patent No.: US 12,647,102 B1
(45) Date of Patent: Jun. 2, 2026

(54) RECONFIGURABLE METASURFACES AND X-BAND RF DEVICES EMPLOYING THE ACOUSTOELECTRIC EFFECT

(71) Applicant: National Technology & Engineering Solutions of Sandia, LLC, Albuquerque, NM (US)

(72) Inventors: Aleem Mohammad Siddiqui, Albuquerque, NM (US); Thomas Edwin Beechem, III, Lafayette, IN (US); Amun Jarzembski, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 728 days.

(21) Appl. No.: 18/130,148

(22) Filed: Apr. 3, 2023

Related U.S. Application Data

(60) Provisional application No. 63/327,430, filed on Apr. 5, 2022.

(51) Int. Cl.
| | |
|---|---|
| *H01L 27/146* | (2006.01) |
| *H01L 27/16* | (2006.01) |
| *H01L 31/0304* | (2006.01) |
| *H01L 31/0352* | (2006.01) |
| *H01L 37/02* | (2006.01) |
| *H03H 9/02* | (2006.01) |
| *H03H 9/17* | (2006.01) |
| *H03H 9/25* | (2006.01) |
| *H03H 9/64* | (2006.01) |

(52) U.S. Cl.
CPC ...... *H03H 9/6453* (2013.01); *H03H 9/02566* (2013.01); *H03H 9/175* (2013.01); *H03H 9/25* (2013.01)

(58) Field of Classification Search
CPC ...... H03H 9/25; H03H 9/175; H03H 9/02566; H03H 9/6453
See application file for complete search history.

(56) References Cited

PUBLICATIONS

Ahmadivand, A. et al., "Tunable THz wave absorption by graphene-assisted plasmonic metasurfaces based on metallic split ring resonators," J. Nanopart. res. (2017) 19:3, 14 pages.

(Continued)

*Primary Examiner* — Emily P Pham
*Assistant Examiner* — Monica Mata
(74) *Attorney, Agent, or Firm* — Mark A. Dodd

(57) ABSTRACT

A reconfigurable metasurface device that leverages the interaction of phonon modes and a charge carrier distribution in a thin film semiconductor/piezoelectric film stack via the acoustoelectric interaction is disclosed. A surface acoustic wave (SAW) is launched into the piezoelectric layer. The SAW propagates through the piezoelectric layer, where the resulting strain wave induces a corresponding propagating electric field. This electric field capacitively couples to the thin film semiconductor, where it electrostatically induces periodic modulations of the charge carriers. The charge carrier distribution in the thin film semiconductor will form ribbons of charge carriers following the constant phase fronts of a sufficiently large amplitude SAW. By controlling the charge carrier patterning one can modulate the coupling to the plasmonic modes in the thin film semiconductor. By controlling the charge carrier patterning via the power and wavelength of the SAW, a reconfigurable metasurface results.

20 Claims, 25 Drawing Sheets

(56)          References Cited

PUBLICATIONS

Baquero, H. A., "Plasmonic waves in two-dimensional electron gas," IOP Conf. Series: journal of Physics: Conf. Series (2018) 1141:012006, 5 pages.

Bhaskar, U. K. et al., "Silicon acoustoelectronics with thin film lithium niobate," J. Phys. D: Appl. Phys. (2019) 52:05LT01, 6 pages.

Brazhe, R. A. et L., "Plasmon-Acoustic Transducers Based on Graphene-2D Boron Nitride Structures for the Terahertz-Frequency Range," Semiconductors (2020) 54(13):1770-1774.

De Fazio, D. et al., "High-Mobility, Wet-Transferred Graphene Grown by Chemical Vapor Deposition," ACS Nano (2019) 13:8926-8935.

Deng, B. et al., "Strong mid-infrared photoresponse in small-twist-angle bilayer graphene," Nature Photonics (2020) 14:549-553.

Fandan, R. et al., "Acoustically-driven surface and hyperbolic plasmon-phonon polaritons in graphene/h-BN heterostructures on piezoelectric substrates," Journal of Physics D: Applied Physics (2018) 51:204004, 10 pages.

Fandan, R. et al., "Exciton-Plasmon Coupling in 2D Semiconductors Accessed by Surface Acoustic Waves," ACS Photonics (2021) 8:1698-1704.

Ghosh, S. et al., "Acoustoelectric amplification of Rayleigh waves in low sheet density AlGaN/GaN heterostructures on sapphire," Appl. Phys. Lett. (2019) 114:063502, 5 pages.

Hernandez-Minguez, A. et al., "Interaction of surface acoustic waves with electronic excitations in graphene," Journal of Physics D: Applied Physics (2018) 51:383001, 17 pages.

Jablan, M. et al., "Plasmonics in graphene at infrared frequencies," Physical Review B (2009) 80:245435, 7 pages.

Jarzembski, A. et al., "Enhancing Graphene Plasmonic Device Performance via its Dielectric Environment," Physical Review Applied (2020) 14:034044 10 pages.

Jin, S. et al., "Modulation of terahertz radiation from graphene surface plasmon polaritons via surface acoustic wave," Optics Express (2019) 27(8):11137-11151.

Kononenko, O. V. et al., "Photoresponse in Multilayer Graphene during the Passage of a Surface Acoustic Wave," Technical Physics Letters ((2020) 46(3):220-223.

Lee, C.-W. et al., "Tunable metasurfaces for visible and SWIR applications," Nano Convergence (2020) 7:3, 11 pages.

Leonard, F. et al., "Dynamic Wavelength-Tunable Photodetector Using Subwavelength Graphene Field-Effect Transistors," Scientific Reports (2017) 7:45873, 8 pages.

Malocha, D. C. et al., "Acoustoelectric Amplifier With 1.2-dB Insertion Gain Monolithic Graphene Construction and Continuous Wave Operation," IEEE Transactions on Ultrasonics, Ferroelectrics, and Frequency Control (2020) 67(9):1960-1963.

Mansoorzare, H. et al., "Non-Reciprocal Lithium Niobate-on-Silicon Acoustoelectric Delay Lines," 2020 IEEE/MTT-S International Microwave Symposium (IMS) (2020) Oct. 14, pp. 532-534.

Nie, X. et al., "Surface acoustic wave induced phenomena in two-dimensional materials," Nanoscale Horiz. (2023) 8:158-175.

Okuda, S. et al., "Graphene Surface Acoustic Wave Sensor for Simultaneous Detection of Charge and Mass," ACS Sens. (2018) 3:200-204.

Poole, T. et al., "Acoustoelectric photoresponse in graphene," Applied Physics Letters (2015) 106:133107, 4 pages.

Poole, T. et al., "Acoustoelectric photoresponse of graphene nanoribbons," Journal of Physics D: Applied Physics (2018) 51:154001, 5 pages.

Schiefele, J. et al., "Coupling Light into Graphene Plasmons through Surface Acoustic Waves," Physical review Letters (2013) 111:237405, 5 pages.

Schulein, F. J. R. et al., "Surface Acoustic Wave Controlled Charge Dynamics in a Thin InGaAs Quantum Well," JETP Letters (2012) 95(11):575-580.

Siddiqui, A. M. et al., "Comparison of amplification via the acoustoelectric effect of Rayleigh and Leaky-SAW modes in a monolithic surface InP:InGaAs/lithium niobate heterostructure," Ferroelectrics (2020) 557:58-65.

Smirnova, D. A. et al., "Tunable nonlinear graphene metasurfaces," Physical Review B (2015) 92:161406(R), 6 pages.

100

150<sub>A</sub>     130     150<sub>B</sub>

140<sub>A</sub>     110

100

140<sub>A</sub>     150<sub>A</sub>     120     130     150<sub>B</sub>     140<sub>B</sub>

110

$$k^2_{eff} = 20\%$$

1500

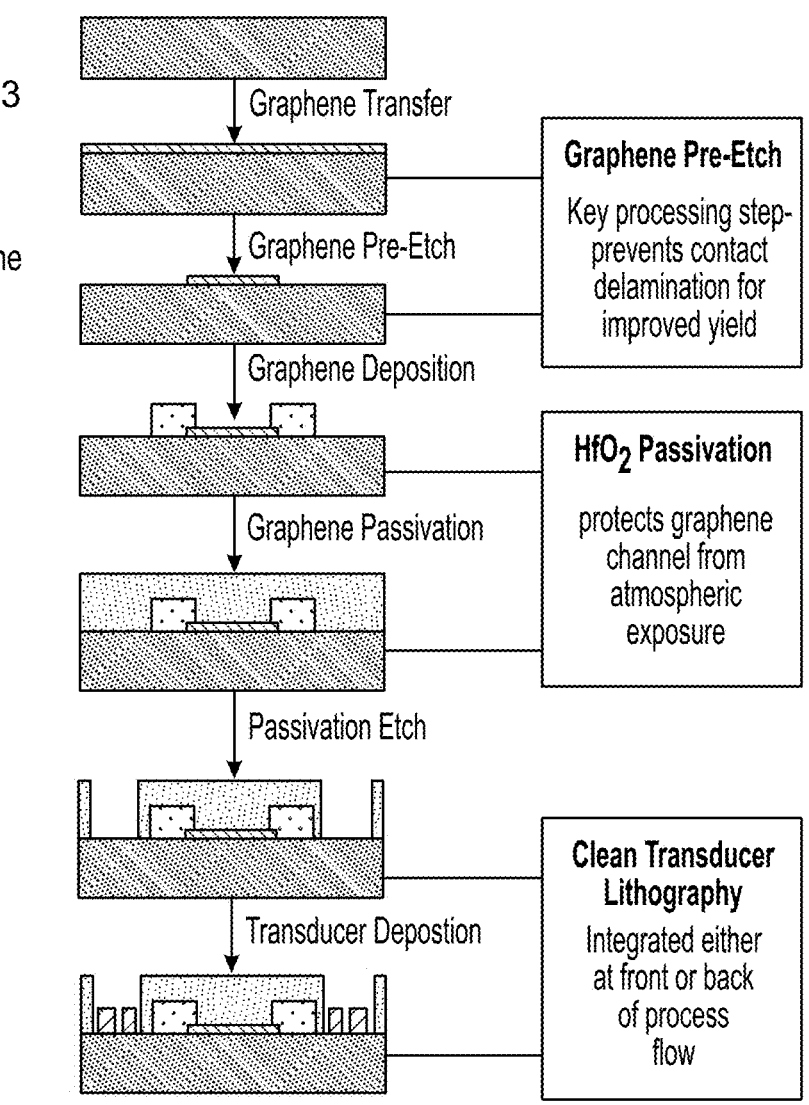

LiNbO$_3$

Al

Au

Graphene

HfO$_2$

Graphene Transfer

Graphene Pre-Etch

Graphene Pre-Etch

Key processing step-
prevents contact
delamination for
improved yield

Graphene Deposition

Graphene Passivation

HfO$_2$ Passivation protects graphene
channel from
atmospheric
exposure

Passivation Etch

Transducer Depostion

**Clean Transducer
Lithography**

Integrated either
at front or back
of process
flow

RECONFIGURABLE METASURFACES AND X-BAND RF DEVICES EMPLOYING THE ACOUSTOELECTRIC EFFECT

RELATED APPLICATIONS

This application claims priority to U.S. Provisional Application No. 63/327,430, filed on Apr. 5, 2022, and entitled RECONFIGURABLE METASURFACES AND X-BAND RF DEVICES EMPLOYING THE ACOUSTOELECTRIC EFFECT, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a device in which electric fields generated by a surface acoustic wave in a piezoelectric substrate can pattern charge carriers in an adjacent semiconductor thin film via the acoustoelectric effect and thus reconfigure the optical transmission in an unpatterned metasurface.

BACKGROUND

Reconfigurable optoelectronics are central to applications ranging from sensing to communication. Metasurfaces, plasmonic modulators, and single-photon emitters are being pursued to this end but remain insufficient in their ability to tune at the levels required to make this a compelling application. The limitations stem from two causes. First, large tunability is realized only through reliability-limiting mechanical movement or power intensive phase-change materials. While electrostatic gate-tuning of electro-optic materials solves these two problems, this approach results in a much smaller spectral tuning range.

Thus, the need exists for a solution that exhibits the advantages of each approach, i.e., no moving parts or phase change materials combined with a large spectral tuning range.

SUMMARY

One aspect of the present invention relates to a reconfigurable metasurface device that leverages the interaction of phonon modes and electron charge distribution in a thin film semiconductor/piezoelectric film stack via the acoustoelectric interaction. A large amplitude surface acoustic wave (SAW) is launched by interdigitated transducers into a piezoelectric layer. The SAW propagates through the piezoelectric layer, where the resulting strain wave induces a corresponding periodic electric field that propagates at the speed of sound within the piezoelectric layer. This electric field is capacitively coupled to an adjacent thin film semiconductor, where it electrostatically induces periodic modulations of charge carrier density via modulations of the local Fermi level. If the amplitude of the SAW is great enough, the two-dimensional charge carrier distribution in the thin film semiconductor will form ribbons of charge carriers following the constant phase fronts of the SAW. The result may be thought of as a charge carrier conveyer belt. By controlling the charge carrier patterning, one can modulate the coupling to the associated plasmonic modes in the thin film semiconductor. Because the charge carrier patterning is controlled by the power and wavelength of the SAW, this approach can realize a truly reconfigurable metasurface leveraging the acoustoelectric gating of the thin film semiconductor.

In at least one embodiment of the invention, a reconfigurable metasurface device comprises a piezoelectric substrate, at least one interdigitated transducer (IDT) (the at least one IDT located on the piezoelectric substrate, the at least one IDT receiving a radio frequency (RF) input signal and generating a surface acoustic wave (SAW) in the piezoelectric substrate in response to the received RF signal), and a thin film semiconductor layer (the thin film semiconductor layer located on the piezoelectric substrate adjacent the at least one IDT, the thin film semiconductor layer forming a charge carrier pattern in response to the SAW in the piezoelectric substrate, the thin film semiconductor layer creating plasmons in response to the charge carrier pattern).

In various embodiments, the piezoelectric substrate includes a piezoelectric layer, the piezoelectric layer including one of lithium niobate ($LiNbO_3$), aluminum nitride (AlN), or scandium aluminum nitride (ScAlN); the piezoelectric substrate further includes a cavity formed below at least a portion of the piezoelectric layer; the at least one IDT includes two IDTs, a first of the two IDTs adjacent a first edge of the thin film semiconductor layer, a second of the two IDTs adjacent a second edge of the thin film semiconductor layer opposite the first edge (each of the two IDTs receiving a corresponding RF signal, the two IDTs generating a standing SAW in the piezoelectric substrate in response to the received RF signals); the at least one IDT includes two IDTs, a first of the two IDTs adjacent a first edge of the thin film semiconductor layer, a second of the two IDTs adjacent a second edge of the thin film semiconductor layer opposite the first edge (a first of the two IDTs receiving a corresponding RF signal, the first of the two IDTs generating a standing SAW in the piezoelectric substrate in response to the received RF signals, a second of the two IDTs acting as a reflector for the standing SAW); and the at least one IDT includes two IDTs, a first of the two IDTs adjacent a first edge of the thin film semiconductor layer, a second of the two IDTs adjacent a second edge of the thin film semiconductor layer orthogonal to the first edge (each of the two IDTs receiving a corresponding RF signal, each of the two IDTs generating a corresponding SAW in the piezoelectric substrate in response to a corresponding received RF signal).

In other embodiments, the at least one IDT includes four IDTs, a first of the four IDTs is adjacent a first edge of the thin film semiconductor layer, a second of the four IDTs is adjacent a second edge of the thin film semiconductor layer opposite the first edge (each of the first and second IDTs receiving a corresponding RF signal, the first and second IDTs generating a first standing SAW in the piezoelectric substrate in a first direction in response to the received RF signals), and a third of the four IDTs is adjacent a third edge of the thin film semiconductor layer orthogonal to the first edge, a fourth of the four IDTs is adjacent a fourth edge of the thin film semiconductor layer opposite the third edge (each of the third and fourth IDTs receiving a corresponding RF signal, the third and fourth IDTs generating a second standing SAW in the piezoelectric substrate in a second direction orthogonal to the first direction in response to the received RF signals); the at least one IDT includes four IDTs, a first of the four IDTs is adjacent a first edge of the thin film semiconductor layer, a second of the four IDTs is adjacent a second edge of the thin film semiconductor layer opposite the first edge (the first IDT receiving a first RF signal, the first IDT generating a first standing SAW in the piezoelectric substrate in a first direction in response to the received RF signals, the second IDT acting as a reflector for the first standing SAW), and a third of the four IDTs is adjacent a third edge of the thin film semiconductor layer orthogonal to the first edge, a fourth of the four IDTs is adjacent a fourth edge of the thin film semiconductor layer opposite the third edge (the third IDT receiving a second RF signal, the third IDT generating a second standing SAW in the piezoelectric substrate in a second direction orthogonal to the first direction in response to the received RF signals, the fourth IDT acting as a reflector for the second standing SAW); and the at least one IDT includes N pairs of IDTs (a first of each corresponding pair of the N pairs of IDTs is adjacent an edge of the thin film semiconductor layer and a second of each corresponding pair of the N pairs of IDTs is adjacent an edge of the thin film semiconductor layer opposite the first of each corresponding pair of the N pairs of IDTs).

In yet other embodiments, each of the at least one IDTs is a chirped IDT; the thin film semiconductor layer includes one of graphene, twisted bilayer graphene, gallium arsenide (GaAs), or indium gallium arsenide (InGaAs); the thin film semiconductor layer includes a waveguide, the waveguide carrying an optical signal; each of the at least one IDTs is a focusing IDT (the at least one focusing IDT generating a SAW in the piezoelectric substrate below the waveguide); the reconfigurable metasurface device further comprises two bias electrodes, the two bias electrodes located on the thin film semiconductor layer, a first of the two bias electrodes adjacent a first edge of the thin film semiconductor layer, a second of the two bias electrodes adjacent a second edge of the thin film semiconductor layer opposite the first edge (the two bias electrodes being in ohmic electrical contact with the thin film semiconductor layer, the two bias electrodes receiving a bias voltage and causing a current to flow in the thin film semiconductor layer); and each of the two bias electrodes includes at least one of titanium (Ti), gold (Au), or silver (Ag).

In still other embodiments, the thin film semiconductor layer receives an optical signal and reflects a first portion of the optical, transmits a second portion of the optical signal, and absorbs a third portion of the optical signal; the reconfigurable metasurface device further comprises a reflector, the reflector formed on a side of the piezoelectric substrate opposite the thin film semiconductor layer (the reflector reflecting the optical signal); the reconfigurable metasurface device further comprises a buffer layer, the buffer layer located between the piezoelectric substrate and the thin film semiconductor layer; the buffer layer includes one or more of aluminum arsenide (AlAs), aluminum nitride AlN, barium fluoride (BaF$_2$), beryllium oxide (BeO), calcium oxide (CaO), hafnium oxide (HfO$_2$), gallium arsenide (GaAs), gallium nitride (GaN), gallium phosphide (GaP), indium arsenide (InAs), indium phosphide (InP), indium antimonide (InSb), magnesium oxide (MgO), manganese oxide (MnO), nickel oxide (NiO), lead zirconium titanate (PZT), silicon carbide (SiC), silicon nitride (Si$_3$N$_4$), or silicon oxide (SiO$_2$); and the reconfigurable metasurface device functions as one of an RF amplifier, a one-dimensional reconfigurable metasurface device, a two-dimensional metasurface device, or an optical modulator.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 17A illustrates the measured RF transmission and reflection for an RF amplifier in accordance with one or more embodiments of the present invention, while

FIG. 21 illustrates a process flow for fabricating a reconfigurable metasurface device in accordance with one or more embodiments of the present invention.

DETAILED DESCRIPTION

Figure 1A:
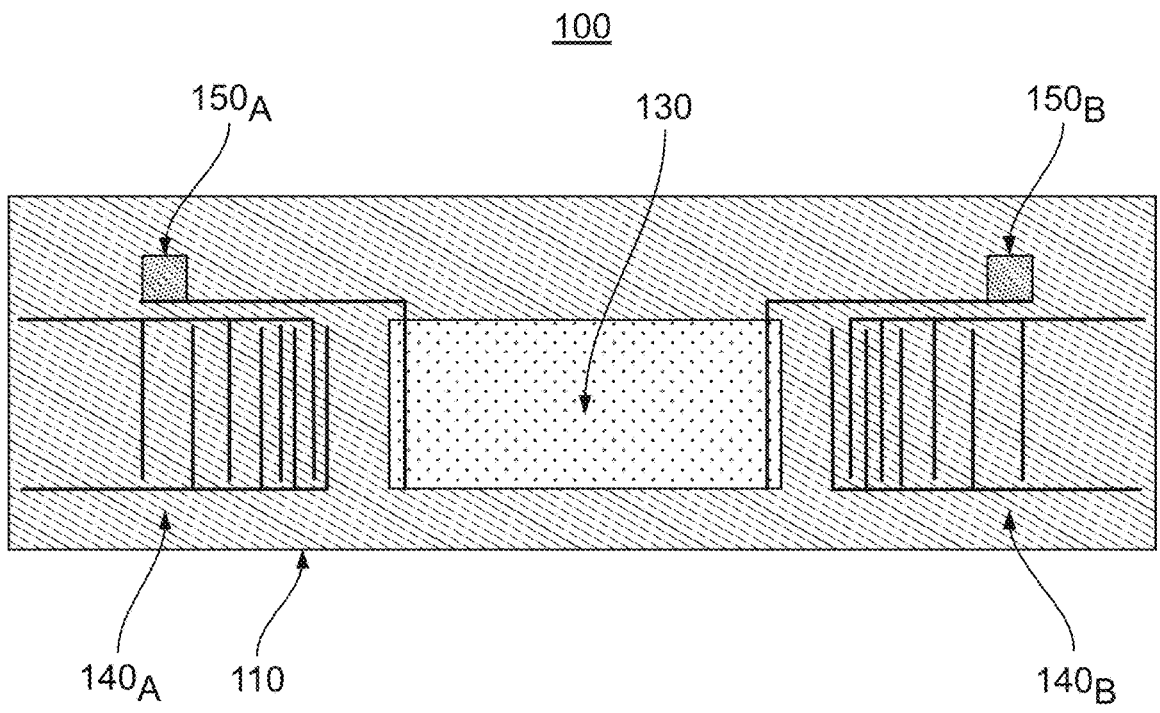
FIGS. 1A and 1B illustrate plan and cross-sectional views, respectively, of a reconfigurable metasurface device in accordance with one or more embodiments of the present invention.
Figure 1B:
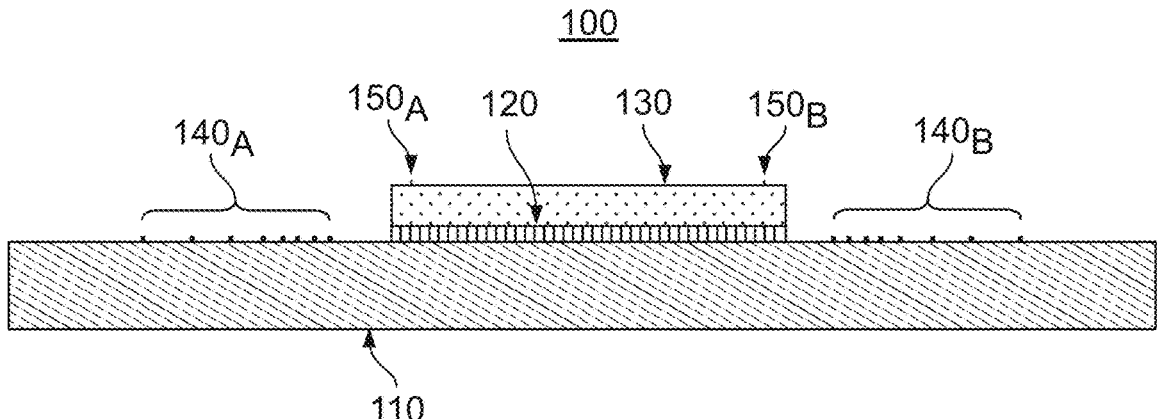

FIGS. 1A and 1B illustrate plan and cross-sectional views, respectively, of a reconfigurable metasurface device 100 in accordance with at least one embodiment of the present invention. The reconfigurable metasurface device 100 includes a piezoelectric substrate 110 formed, for example, of lithium niobate ($LiNbO_3$). A buffer layer 120 is located on the piezoelectric substrate 110, with the buffer layer formed, for example, of silicon dioxide ($SiO_2$). A thin film semiconductor layer 130 is located on the buffer layer 120, with the thin film semiconductor layer 130 formed, for example, of graphene. On the surface of the piezoelectric substrate 110 is a pair of interdigitated transducers (IDTs) 140$_A$, 140$_B$. One of these IDTs 140$_A$ is a transmit IDT in that it is used to launch a large amplitude surface acoustic wave (SAW) into the piezoelectric layer 110, as will be described below with reference to FIGS. 2A-2C. When a traveling SAW is desired, the second IDT 140$_B$ acts as an absorber. Alternatively, when a standing SAW is desired, the second IDT 140$_B$ acts as a reflector or may be actively driven, as will be described below, for example, with reference to FIG. 8. When used as a reflector, the second IDT 140$_B$, in conjunction with the first IDT 140$_A$, creates an acoustic resonator that increases acoustic efficiency at the expense of reduced RF bandwidth. On the surface of the thin film semiconductor layer 130 is a pair of bias electrodes 150$_A$, 150$_B$. A bias voltage is applied between the pair of bias electrodes 150$_A$, 150$_B$ so that a current, with corresponding charge carriers, flows in the thin film semiconductor layer 130.

While the piezoelectric substrate 110 may be formed of $LiNbO_3$, other piezoelectric materials may be used including, for example, aluminum nitride (AlN) or scandium aluminum nitride (ScAlN). Both AlN and ScAlN offer the benefit of being optically transparent in the middle wavelength infrared (MWIR), enabling the formation of an optical resonator in the vertical direction, as will be discussed below. While the piezoelectric substrate 110 illustrated in FIGS. 1A and 1B is solid, the piezoelectric substrate 110 may also include a cavity (not illustrated) below the buffer layer 120 and the thin film semiconductor layer 130, and optionally below the IDTs 140$_A$, 140$_B$. This results in a thin layer of piezoelectric material being suspended over the cavity such that the SAW launched by the IDT 140$_A$ is confined to the thin layer of piezoelectric material, i.e., the energy in the SAW is not coupled to, and thereby not lost to, the bulk of the piezoelectric substrate 110. This embodiment with a thin layer of piezoelectric material results in a more power efficient reconfigurable metasurface device 100.

While the buffer layer 120 may be formed of $SiO_2$, other materials may be used, including, for example, aluminum arsenide (AlAs), AlN, barium fluoride ($BaF_2$), beryllium oxide (BeO), calcium oxide (CaO), hafnium oxide ($HfO_2$), gallium arsenide (GaAs), gallium nitride (GaN), gallium phosphide (GaP), indium arsenide (InAs), indium phosphide (InP), indium antimonide (InSb), magnesium oxide (MgO), manganese oxide (MnO), nickel oxide (NiO), lead zirconium titanate (PZT), silicon carbide (SiC), and silicon nitride ($Si_3N_4$), or alloys thereof. The buffer layer 120 permits one to optimize tuning of the plasmon dispersion in the thin film semiconductor layer 130. For a discussion on tuning the plasmon dispersion by inclusion of the buffer layer 120, see, for example, A. Jarzembski et al., "Enhancing Graphene Plasmonic Device Performance via its Dielectric Environment," Physical Review Applied, vol. 14, no. 3, art. no. 034044 (2020), the contents of which are incorporated herein by reference.

While the thin film semiconductor layer 130 may be formed of graphene, other semiconductor materials may be used depending upon the desired operating frequency. For example, graphene may be used when the desired operating frequency corresponds to the MWIR, through the use of plasmons within the graphene. Note that in some embodiments, the graphene may be a twisted bilayer graphene, which may significantly enhance MWIR performance. For a discussion on using twisted bilayer graphene in the MWIR, see, for example, B. Deng et al., "Strong mid-infrared photoresponse in small-twist-angle bilayer graphene," Nature Photonics, vol. 14, pp. 549-553 (2020), the contents of which are incorporated herein by reference. In contrast, if the desired operating frequency is in the THz range, then plasmons within a two-dimensional electron gas (2DEG) may be used. In this case, the thin film semiconductor layer 130 may, for example, be formed of GaAs or indium gallium arsenide (InGaAs), both of which can support a 2DEG. For a discussion on plasmons in 2DEG structures, see, for example, H. A. Baquero, "Plasmonic waves in two-dimensional electron gas," Journal of Physics: Conference Series 1141, art. no. 012006 (2018), the contents of which are incorporated herein by reference. Other materials with a demonstrated plasmon response include GaN and zinc oxide (ZnO). As ZnO is a piezoelectric semiconductor, it may be used for both the piezoelectric substrate 110 and the thin film semiconductor layer 130.

The IDTs 140$_A$, 140$_B$ may be formed, for example, of an approximately 300 nm thick aluminum layer on an approximately 10 nm thick chrome adhesion layer. The patterning of the IDTs 140$_A$, 140$_B$ preferably is chirped in that the spacing between adjacent fingers is not uniform. This permits the application of radio frequency (RF) signals having a range of frequencies depending upon the desired configuration of the metasurface, as will be described below with reference to FIGS. 7A and 7B.

The bias electrodes 150$_A$, 150$_B$, which need to make Ohmic contact with the thin film semiconductor layer 130, may be formed, for example, of a titanium, gold, silver, gold metal stack with approximate thicknesses of 20 nm, 100 nm, 1000 nm, and 200 nm, respectively.

Figure 2A:
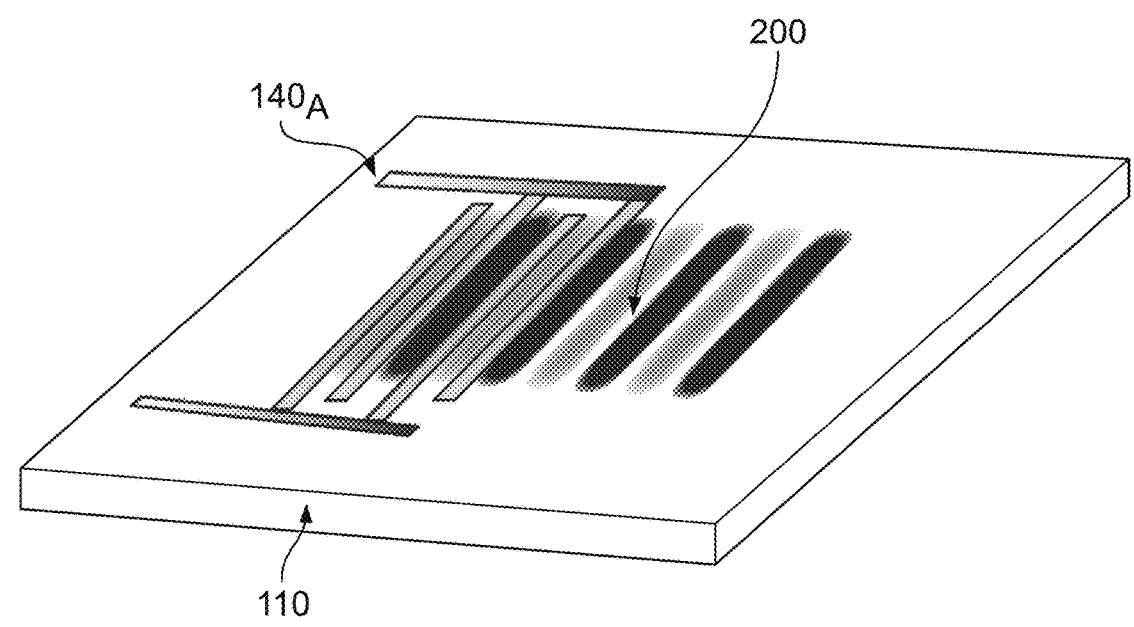
FIGS. 2A-2C illustrate the operating principles of a reconfigurable metasurface device in accordance with one or more embodiments of the present invention.
Figure 2B:
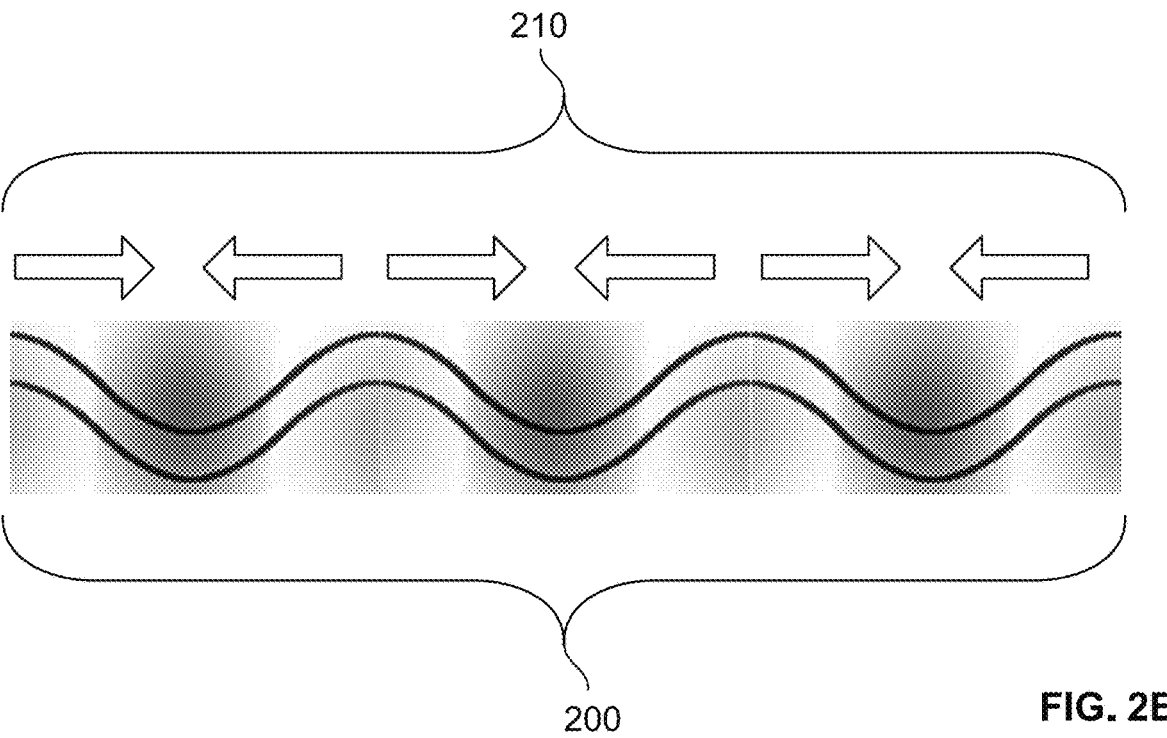
Figure 2C:
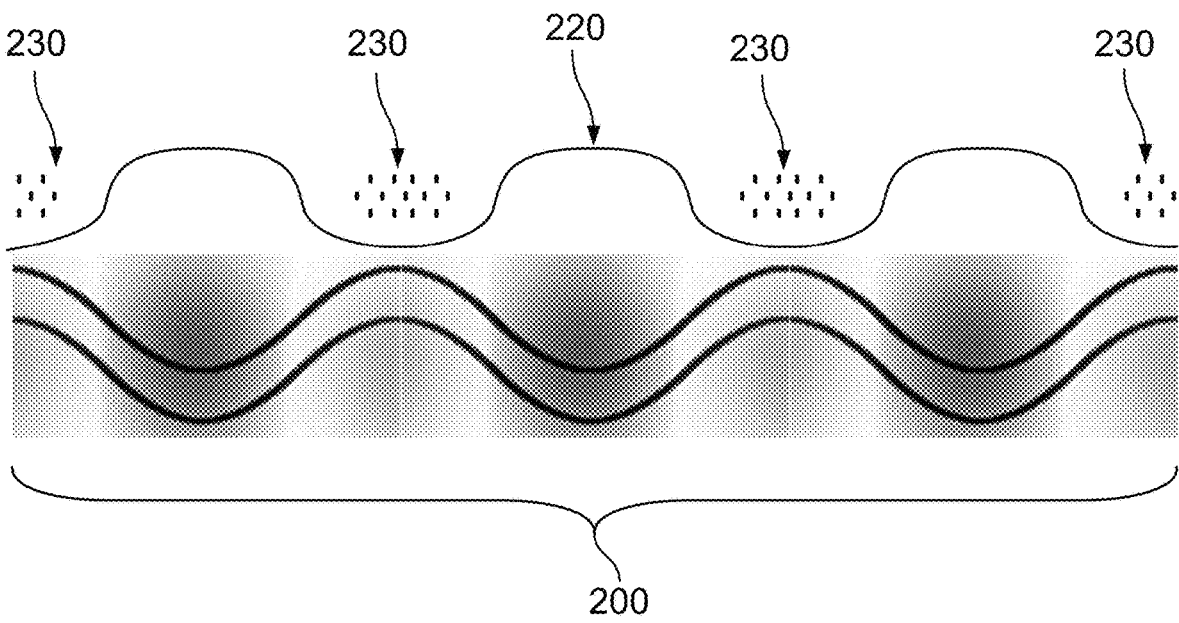

As illustrated in FIG. 2A, application of an RF signal to the IDT 140$_A$ causes the IDT 140$_A$ to launch a traveling SAW 200 into the piezoelectric substrate 110. As illustrated in FIG. 2B, the SAW 200 includes, or induces, a corresponding strain wave component and a corresponding electric field 210. As illustrated in FIG. 2B, this induced electric field 210 changes directions corresponding to the "peaks" and "troughs" of the SAW 200. The net effect, as illustrated in FIG. 2C, is that the launched SAW 200, and its corresponding induced strain wave and electric field 210, create a corresponding potential 220 in the thin film semiconductor layer 130. The charge carriers in the thin film semiconductor layer 130 aggregate in the "troughs" of the potential 220, forming a charge carrier pattern in the form of ribbons of charge carriers 230. These ribbons of charge carriers 230 create plasmons within the thin film semiconductor layer 130 with the goal being to create a grating that will couple light into the plasmon mode through phase matching. For a discussion on coupling light to plasmon modes, see, for example, M. Jablan et al., "Plasmonics in graphene at infrared frequencies," Physical Review B, vol. 80, art. no. 245435 (2009), the contents of which are incorporated herein by reference. A significant difference relative to the prior art is that where the prior art relied solely on SAWs, various embodiments of the present invention employ acoustoelectric coupling between the piezoelectric substrate 110 and the thin film semiconductor layer 130, which is a much stronger coupling mechanism than SAWs alone.

Figure 3A:
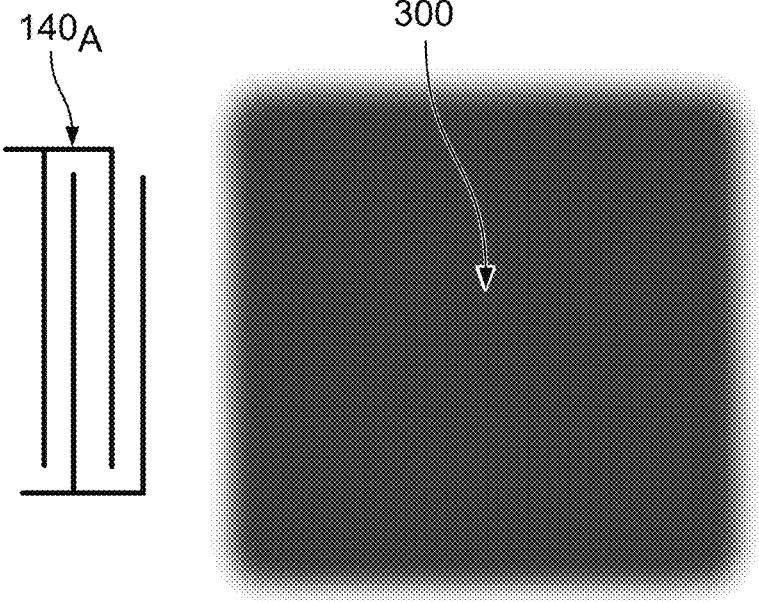
FIGS. 3A and 3B illustrate the charge carrier distribution in a reconfigurable metasurface device in accordance with one or more embodiments of the present invention when the device is off and on, respectively.
Figure 3B:
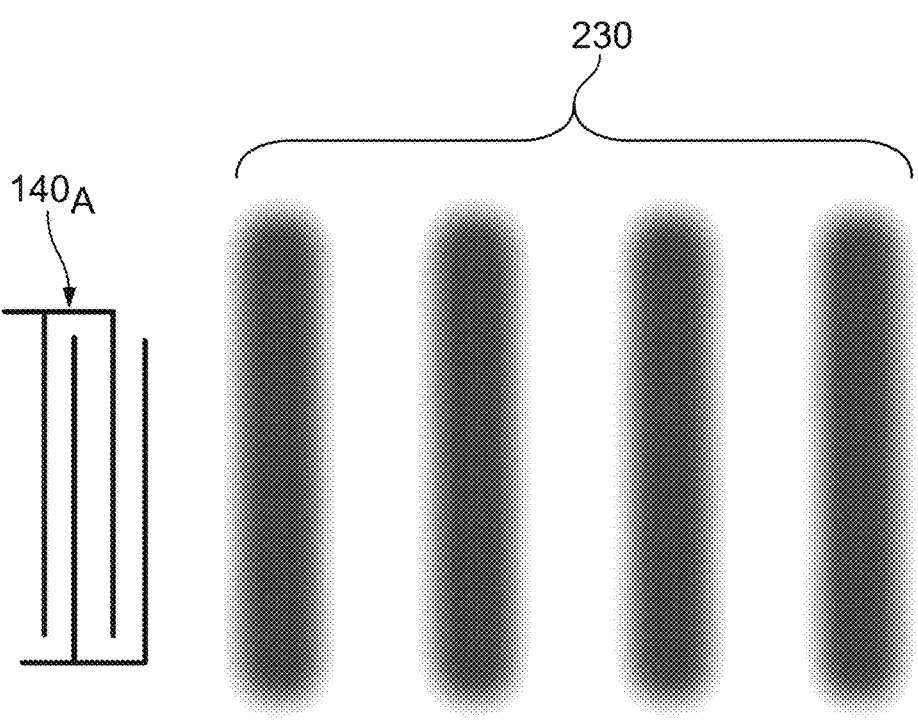

The ribbons of charge carriers 230 are best understood in view of FIGS. 3A and 3B. As illustrated in FIG. 3A, when a bias voltage is applied between the pair of bias electrodes 150$_A$, 150$_B$, but no RF signal is applied to the IDT 140$_A$, the charge carriers 300 in the thin film semiconductor layer 130 are uniformly distributed. In contrast, when a bias voltage is applied between the pair of bias electrodes 150$_A$, 150$_B$ and an RF signal is applied to the IDT 140$_A$, the charge carriers in the thin film semiconductor layer 130 aggregate and form the ribbons of charge carriers 230 described above with reference to FIG. 2C. As the SAW 200 is a traveling wave, for example, left to right in FIG. 3B, the ribbons of charge carriers 230, will likewise travel through the thin film semiconductor layer 130.

The ability to aggregate the charge carriers in the thin film semiconductor layer 130 is a function of both the mobility of the charge carriers as well as the density of the charge carriers in the thin film semiconductor layer 130. This charge carrier aggregation is essentially the large signal behavior of the acoustoelectric interaction where the SAW 200 in the piezoelectric substrate 110 is amplified or attenuated due to the screening interaction between drifting charge carriers in the adjacent thin film semiconductor layer 130 and the evanescent electric field of the SAW 200 itself. The interaction can be captured by the following equations. The propagation of the SAW is described by:

$$\rho \frac{\partial^2 u}{\partial t^2} = c \frac{\partial^2 u}{\partial z^2} - \beta \frac{\partial^2 \varphi}{\partial z^2}, \quad \text{(Eq. 1)}$$

where p is the charge carrier density, u is the amplitude of the SAW 200, and $\beta$ is related to the electromechanical coupling coefficient $$K_t^2.$$

The position of the change carriers within the thin film semiconductor layer 130 is described by:

$$\frac{\partial^2 \varphi}{\partial z^2} = -\frac{4\pi\beta}{\varepsilon} \frac{\partial^2 u}{\partial z^2} + \frac{\partial E_{local}}{\partial z}, \quad \text{(Eq. 2)}$$

where $\phi$ is the local potential of charge carriers in the thin film semiconductor layer 130 and $E_{local}$ is the electric field due to the charge carrier distribution n(z) in the thin film semiconductor layer 130.

The charge carrier drift-diffusion within the thin film semiconductor layer 130 is described by:

$$I = en\mu\left(E_D - \frac{\partial \varphi}{\partial z}\right) - eD\frac{\partial n}{\partial z}, \quad \text{(Eq. 3)}$$

where I is the current in the thin film semiconductor layer 130, e is the electric charge, u is the mobility of the charge carriers, $$\frac{\partial \varphi}{\partial z}$$

is the induced field due to the SAW and internal rearrangement of charge, $E_D$ is the electric field due to the bias voltage applied between the pair of bias electrodes 150$_A$, 150$_B$, and D is the diffusion coefficient of the charge carriers in the thin film semiconductor layer 130. Current continuity within the thin film semiconductor layer 130 is described by:

$$\frac{\partial I}{\partial z} = e \frac{\partial n}{\partial t}. \quad \text{(Eq. 4)}$$

As will be appreciated, charge carrier aggregation will induce variations in the local electric field $E_{local}$. The product of sinusoidal varying terms will result in rectification such that the average value of the current I will be non-zero, which constitutes the acoustoelectric current. Additionally, the product of the charge and the electric field has units of energy, corresponding to the work done by the SAW wave to the charge. In the view of energy balance, the acoustoelectric current density is expressed as:

US 12,647,102 B1

Figure 4A:
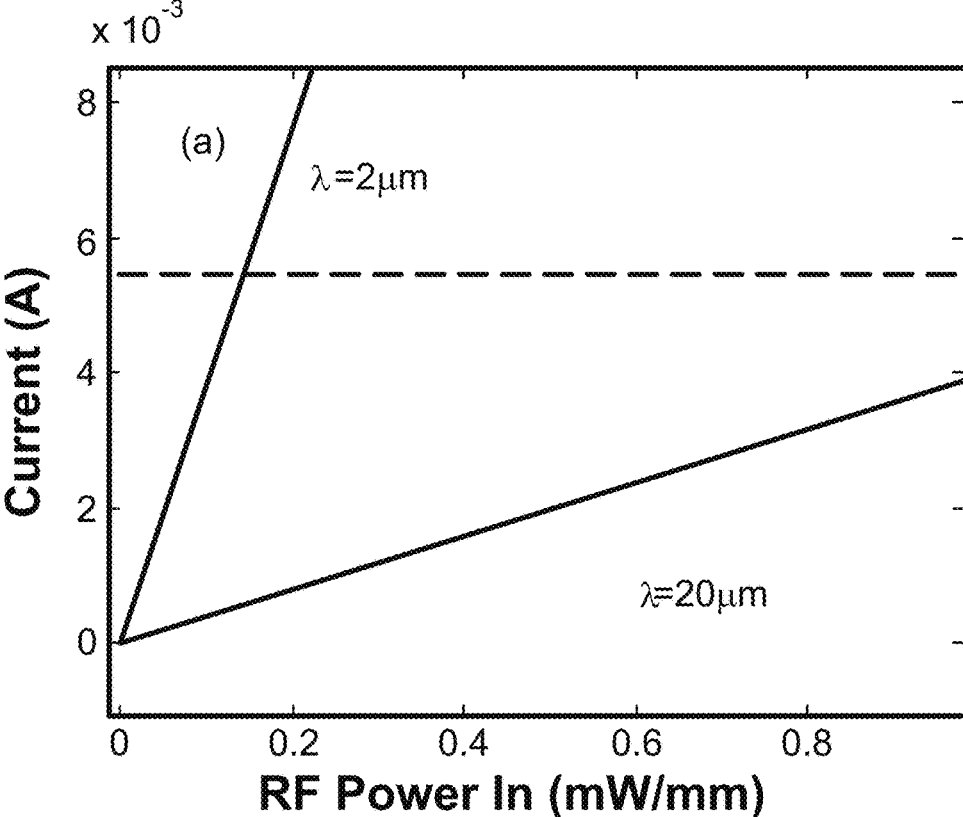
FIGS. 4A-4C illustrate simulated operating characteristics of a reconfigurable metasurface device in accordance with one or more embodiments of the present invention, including frequency scaling, carrier aggregation, and coupling coefficient, respectively.
Figures 4B, 4C:
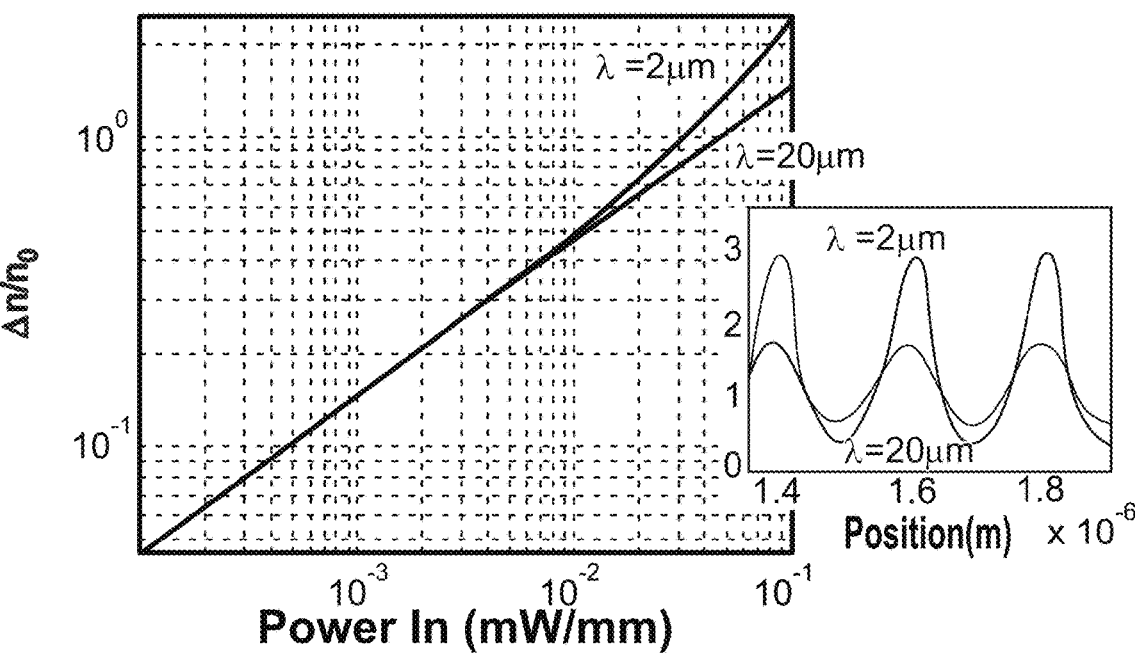

9

$$I_{AE} = \frac{\mu P_R \Gamma}{v},$$  (Eq. 5a)

$$\Gamma_{E=0} = K_r^2 \frac{\pi}{\lambda} \times \frac{\frac{\sigma}{\sigma_m}}{1 + \left(\frac{\sigma}{\sigma_m}\right)^2},$$  (Eq. 5b)

where $P_r$ is the incident power in W/m and $\Gamma$ is the attenuation factor, $\Gamma_{E=0}$ is the zero field attenuation factor, $\sigma = en\mu \times$ d, and $\sigma_m = (\varepsilon_P + \varepsilon_0)v_A$. By substituting in $\Gamma_{E=0}$, the dependency of $I_{AE}$ can be seen to increase for shorter acoustical wavelengths. The slope increases with frequency. However, the maximum saturation current corresponds to when charge is broken up and carried only by the acoustic mode. When this occurs, the current density is $I_{AE,max} = v\sigma$. This maximum current level remains constant, while the slope increases with RF drive frequency. Thus, as illustrated in FIGS. 4A-4C, the ability to aggregate improves with power. Specifically, FIG. 4A illustrates the frequency scaling of $I_{AE}$ as a function of RF drive power as predicted by perturbation theory at wavelengths of 2 μm and 20 μm. FIG. 4B illustrates the predicted carrier aggregation as a function of RF drive power and position, as described below. FIG. 4C illustrates the predicted coupling coefficient using finite element modeling to determine $$K_t^2$$

in AlN at the SAW wavelengths of interest (10s of GHz). The Rayleigh mode, as exhibited by the 20 μm wavelength curve in FIG. 4C, is preferrable as it is confined to the upper surface of the piezoelectric substrate 110, i.e., adjacent to the thin film semiconductor layer 130. The higher order modes, as exhibited by the 2 μm wavelength curves in FIG. 4C, hybridize into the bulk of the piezoelectric substrate 110, thereby increasing scattering losses and reducing coupling to the overlying thin film semiconductor layer 130.

In the limit that the RF drive field dominates the dynamics (i.e., the large amplitude limit), the following expression is valid from which one can derive integrated results:

$$en_s(x)\mu\left[\frac{e\lambda}{2\pi\varepsilon}\frac{\partial n_s}{\partial x} + E_0\sin(kx + \varphi_0)\right] + evn_s(x) = A_0.$$  (Eq. 6)

By relating $E_0$, the electric field of the SAW wave, to $$K_t^2,$$

the coupling coefficient, and therefore the incident RF power carried by the SAW, FIG. 4B illustrates the numerical solution to Equation 6 as a function of RF drive power. The illustrated result assumed $$K_t^2 \sim 0.2\%,$$

which was determined by finite element modeling (in COMSOL) by calculating the shift in dispersion subject to open and shorted boundary conditions. The combined analysis of Equation 6 and the coupling coefficient calculation constitutes a numerical tool to predict carrier aggregation across various mode types in various materials. The results illustrated in FIGS. 4A-4C assumed the material is AlN. While greater carrier aggregation can be achieved in LN, the more favorable optical properties of AlN make it more suitable for certain embodiments of the present invention.

Figure 5:
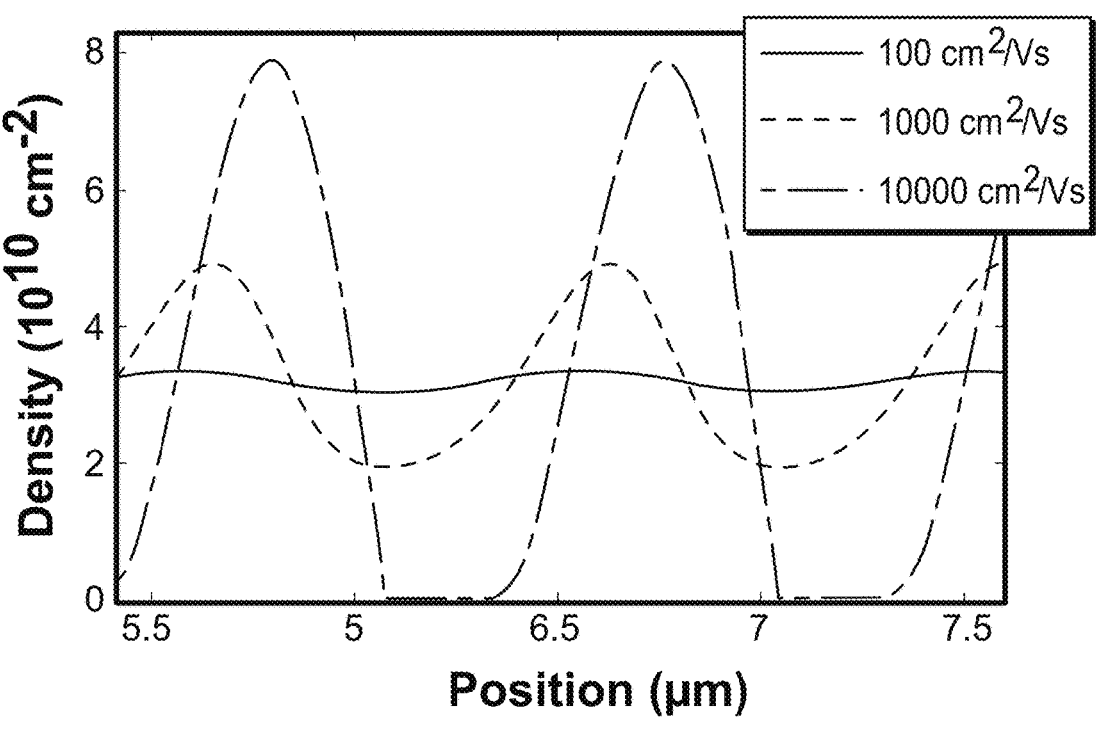
FIG. 5 illustrates the simulated charge carrier density as a function of position for three different mobilities in a thin film semiconductor layer of a reconfigurable metasurface device in accordance with one or more embodiments of the present invention.

To determine how much RF power would be needed to create sufficient charge carrier aggregation in the thin film semiconductor layer 130, finite-difference time-domain (FDTD) simulations employing the above equations were conducted. The following simulations assumed an electromechanical coupling coefficient $$K_t^2$$

of 5%, an average charge carrier density of 250e10 cm$^{-2}$, and an RF power density of 2 mW/mm, with μ, the mobility of the charge carriers, as the variable. FIG. 5 illustrates the charge carrier density in the thin film semiconductor layer 130 as a function of position for three different mobilities u: 100 cm$^2$/Vs, 1,000 cm$^2$/Vs, and 10,000 cm$^2$/Vs. FIG. 5 clearly illustrates that a higher mobility u for a given RF power density increases charge carrier aggregation. To improve the power efficiency of the reconfigurable metasurface device 100, a thin film semiconductor layer 130 having a greater mobility μ should be employed.

Using the developed models for LN SAWs, transducers for acoustoelectric delay lines were designed for peak transmission frequencies from 100 MHz to 1 GHz. To simplify optical characterization of the graphene layer, the delay length and aperture width of the devices were both constrained to approximately 500 μm. 100 nm aluminum electrodes were chosen for their low mass loading and high conductivity. The designs were found to have a typical insertion loss of approximately-6 dB, which is the limit for these type of delay lines.

Figure 6A:
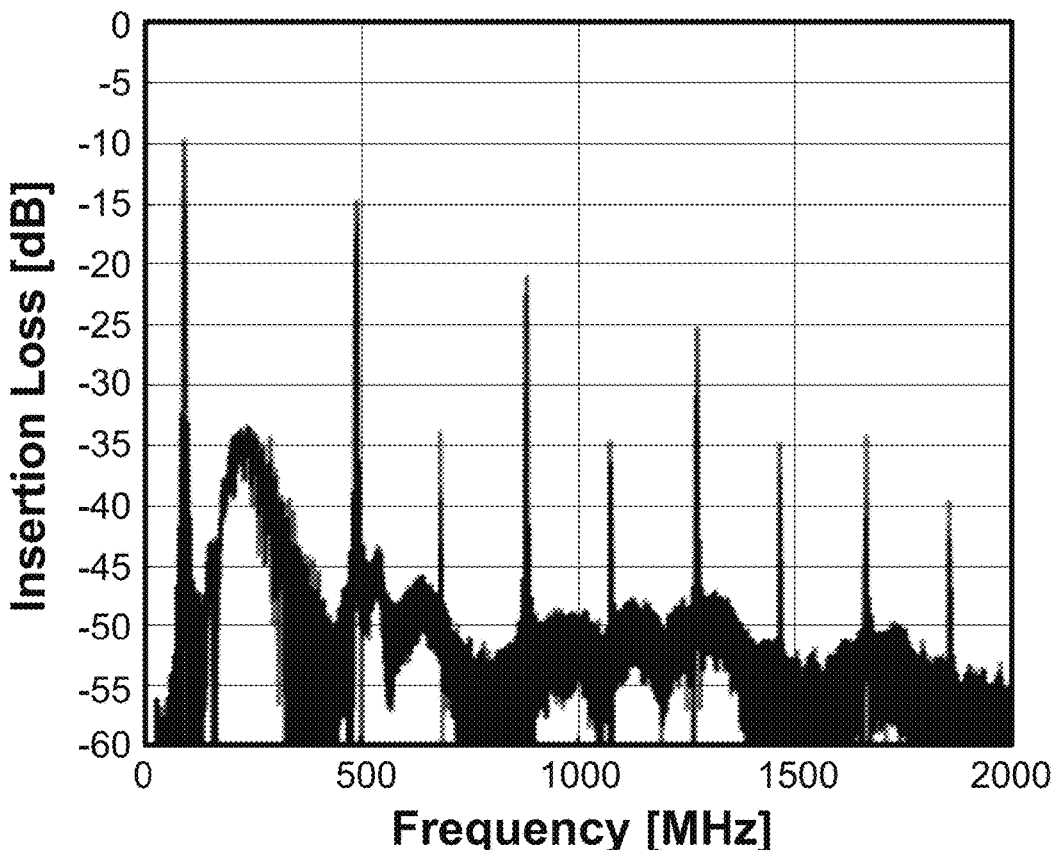
FIGS. 6A and 6B illustrate the measured insertion losses of a reconfigurable metasurface device in accordance with one or more embodiments of the present invention at operating frequencies of 100 MHz and 1 GHz, respectively.
Figure 6B:
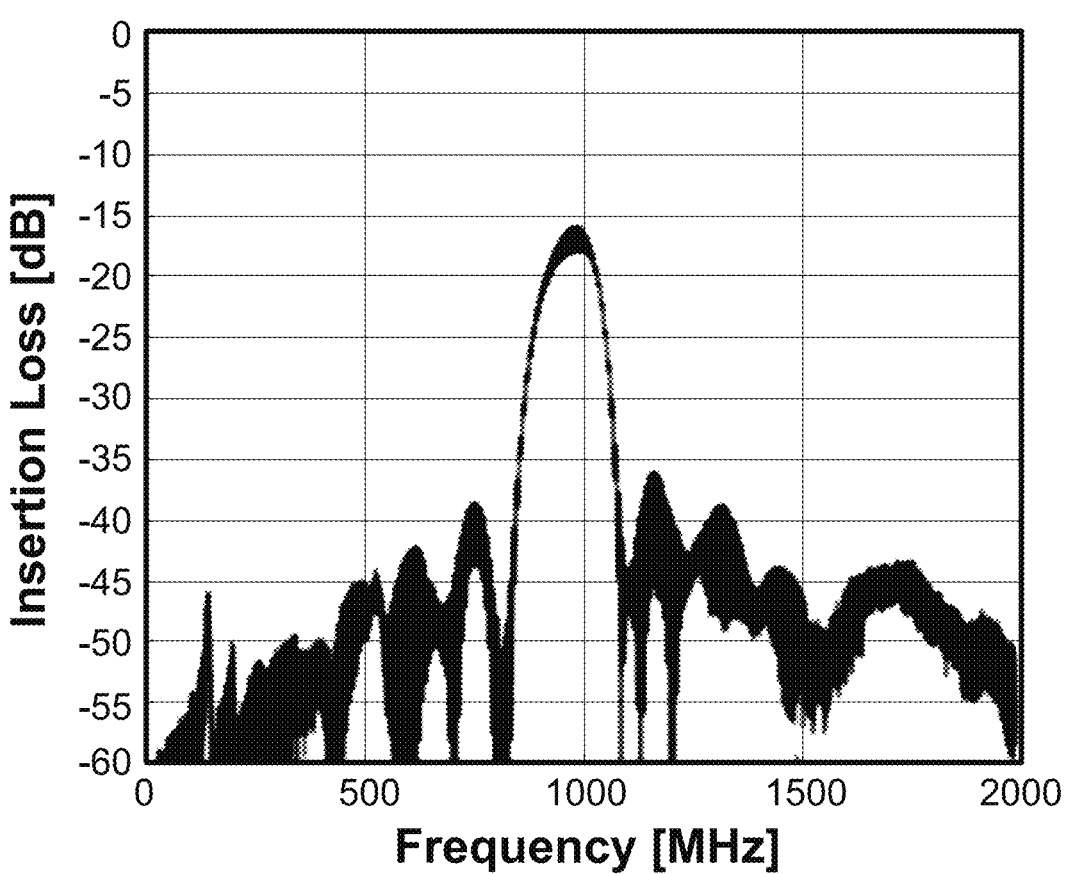

These devices were then fabricated and tested using an autoprober, a network analyzer, and GSG probes after performing a short-open-load-through (SOLT) calibration. Devices were found to vary from approximately −10 dB insertion loss at 100 MHz to approximately −15 dB at 1 GHz, as illustrated in FIGS. 6A and 6B, respectively. This discrepancy is expected as Ohmic losses of the IDT fingers were not taken in account during modelling. These Ohmic losses will increase with frequency as the width of the IDT fingers decrease to maintain λ/4 width, and the number of fingers in parallel decreases to maintain a 500Ω match. As illustrated in FIG. 6A, one can operate a lower frequency device in a higher frequency mode through the excitation of higher order harmonics, though at reduced efficiency.

As acoustoelectric coupling increases with frequency, this provided motivation to design and fabricate higher frequency SAW delay lines. Using photolithography to define the electrode features, IDTs on LN are limited to about 1 GHz due to the ~1 um feature size. To increase operating frequency requires, for example, an electron beam (ebeam) lithography process and new design concepts to combat the challenges of small wavelength design.

Analysis showed that the IDTs should produce a small perturbation of the SAW properties. As the target designs using ebeam lithography are small wavelengths, it was anticipated that the perturbations of the electrodes would be large. In addition to this, how the length and number of electrode fingers at various feature sizes would affect the yield was unknown as ebeam lithography for SAW transducers had not been previously attempted. To determine the optimal ebeam design, a large number of SAW delay lines with various wavelengths and design parameters were fabricated on coupons of LN and subsequently characterized to determine device yield and performance.

Figure 7:
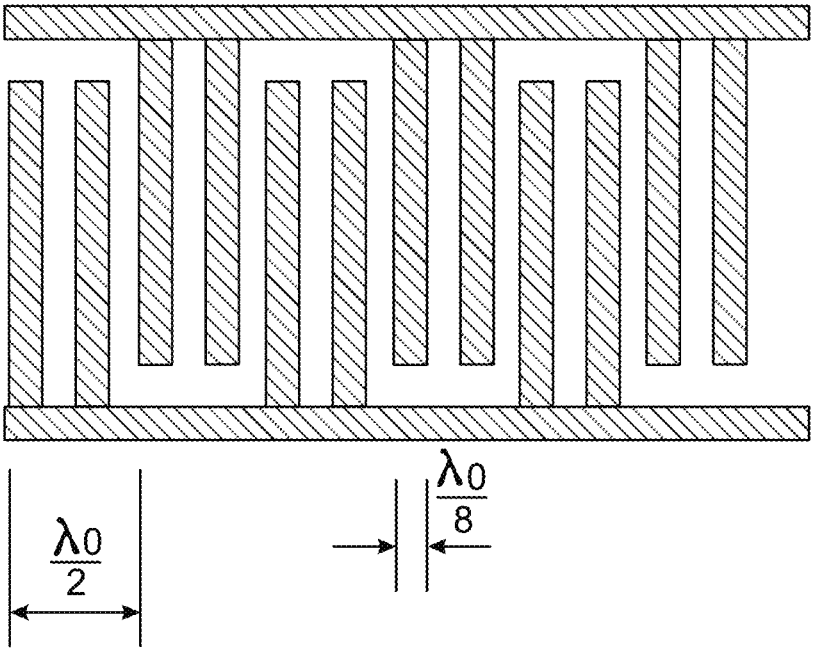
FIG. 7 illustrates split-finger IDTs that may be used with a reconfigurable metasurface device in accordance with one or more embodiments of the present invention.
Figure 8:
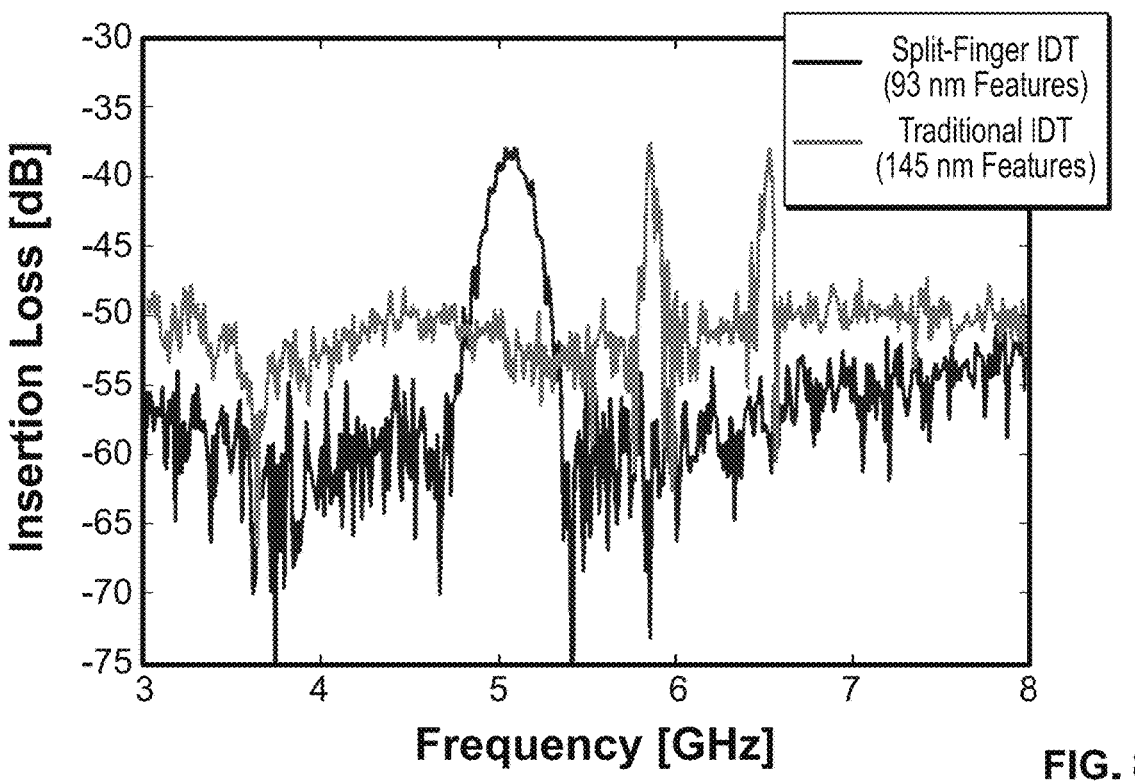
FIG. 8 illustrates the measured improvement in the SAW transmission profile by incorporating a split-finger IDT design in a reconfigurable metasurface device in accordance with one or more embodiments of the present invention.

Based on these device studies, two major changes were made in the ebeam designs. The first major change was the incorporation of split-finger IDTs. Typical SAW transducers are designed using λ/4 width IDTs. SAWs can scatter off each electrode finger, interfering with the main transmitted acoustic mode. As the wavelengths for the ebeam devices are small, the strength of the scattering from the electrodes (50 nm of aluminum) was found to be quite large. Split-finger IDTs are designed to be λ/8 wide, as illustrated in FIG. 7. When acoustic waves scatter off split-finger IDTs, the scattered waves all destructively interfere with each other, and the main mode is left unperturbed. In exchange for robustness against inter-IDT scattering, the frequency of the transducer is now halved for the same feature size. FIG. 8 illustrates the measured improvement in the SAW transmission profile by incorporating the split-finger designs. With traditional electrodes, it appears that the inter-IDT reflection disturbs the SAW response so much that the acoustic transmission splits into two asymmetrical modes. With the split-finger design, the mode splitting is gone, and the SAW transmission has the traditional sinc function profile. Peak transmission for these devices was −37.6 dB.

Figure 9:
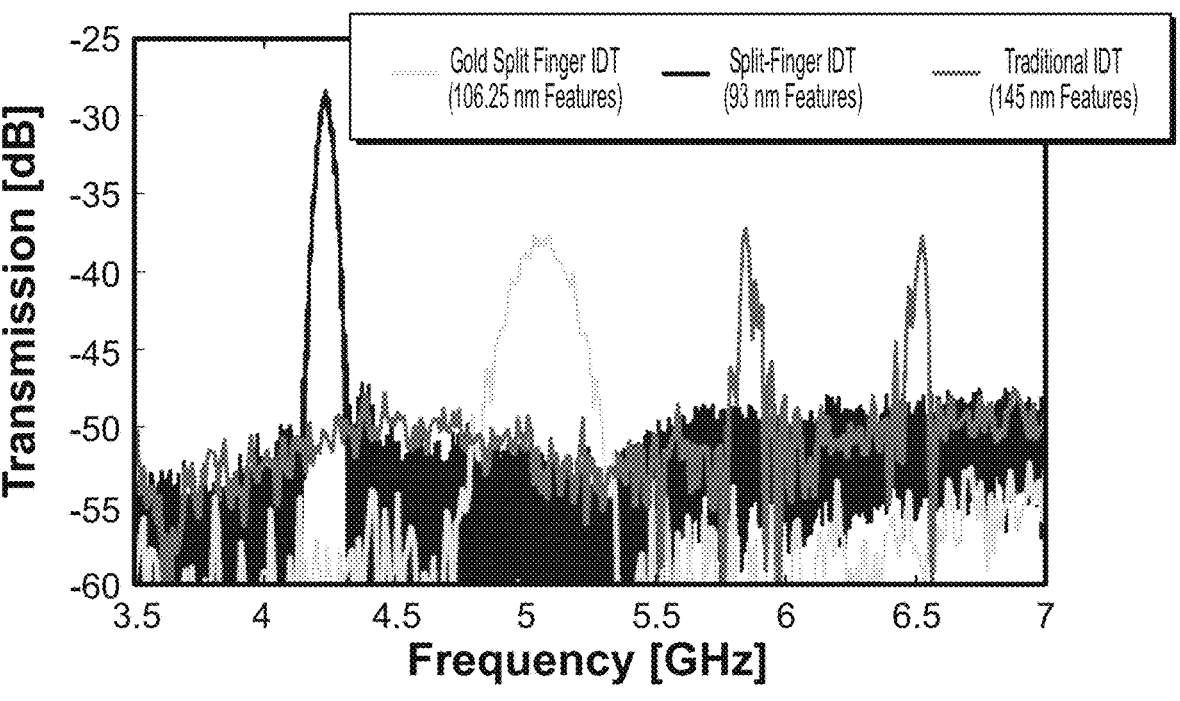
FIG. 9 illustrates the measured improvement in the SAW transmission profile by incorporating a gold split-finger IDT design in a reconfigurable metasurface device in accordance with one or more embodiments of the present invention.

The second major change was the choice of electrode metal for the IDTs. Specifically, the electrode metal was changed from 50 nm of aluminum to 70 nm of gold. This was done as gold has a higher conductivity, resulting in lower Ohmic losses. Gold also has a higher electromigration voltage, meaning that higher powers can be transduced without damage to the IDTs. The trade-off, however, is that gold is heavier than aluminum, slowing the SAW velocity and lowering the frequency slightly for the same feature sizes. FIG. 9 illustrates the measured results for an 850 nm wavelength design incorporating both changes. Peak transmission for the gold IDT devices was found to be −28.4 dB, giving an order-of-magnitude improvement in acoustic wave transmission over the aluminum IDT devices with similar feature sizes.

Figure 10A:
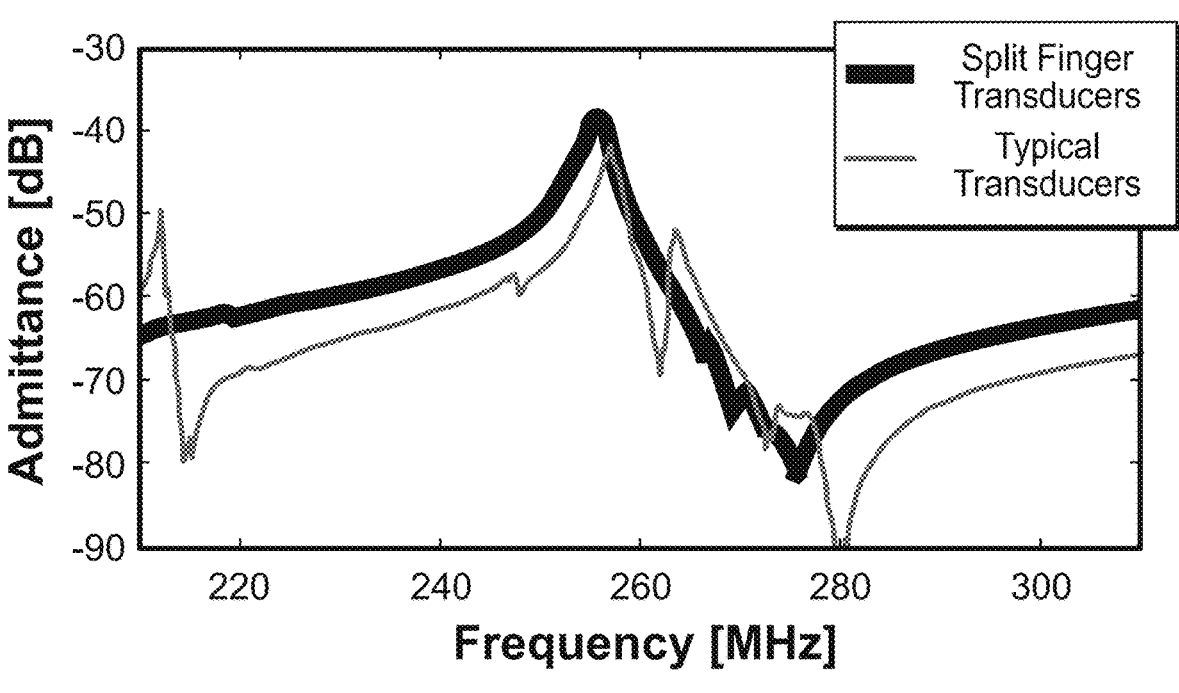
FIGS. 10A-10C illustrate the measured responses of reconfigurable metasurface devices in accordance with one or more embodiments of the present invention having various design parameters.
Figure 10B:
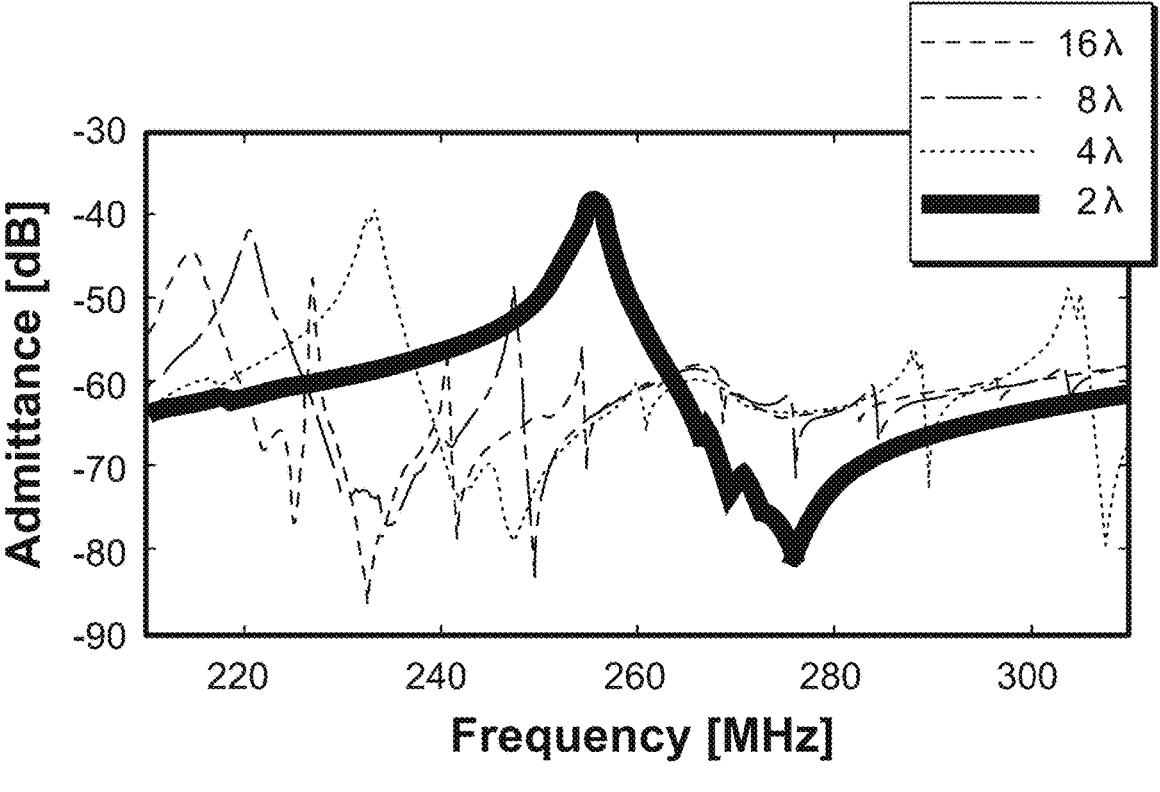
Figure 10C:
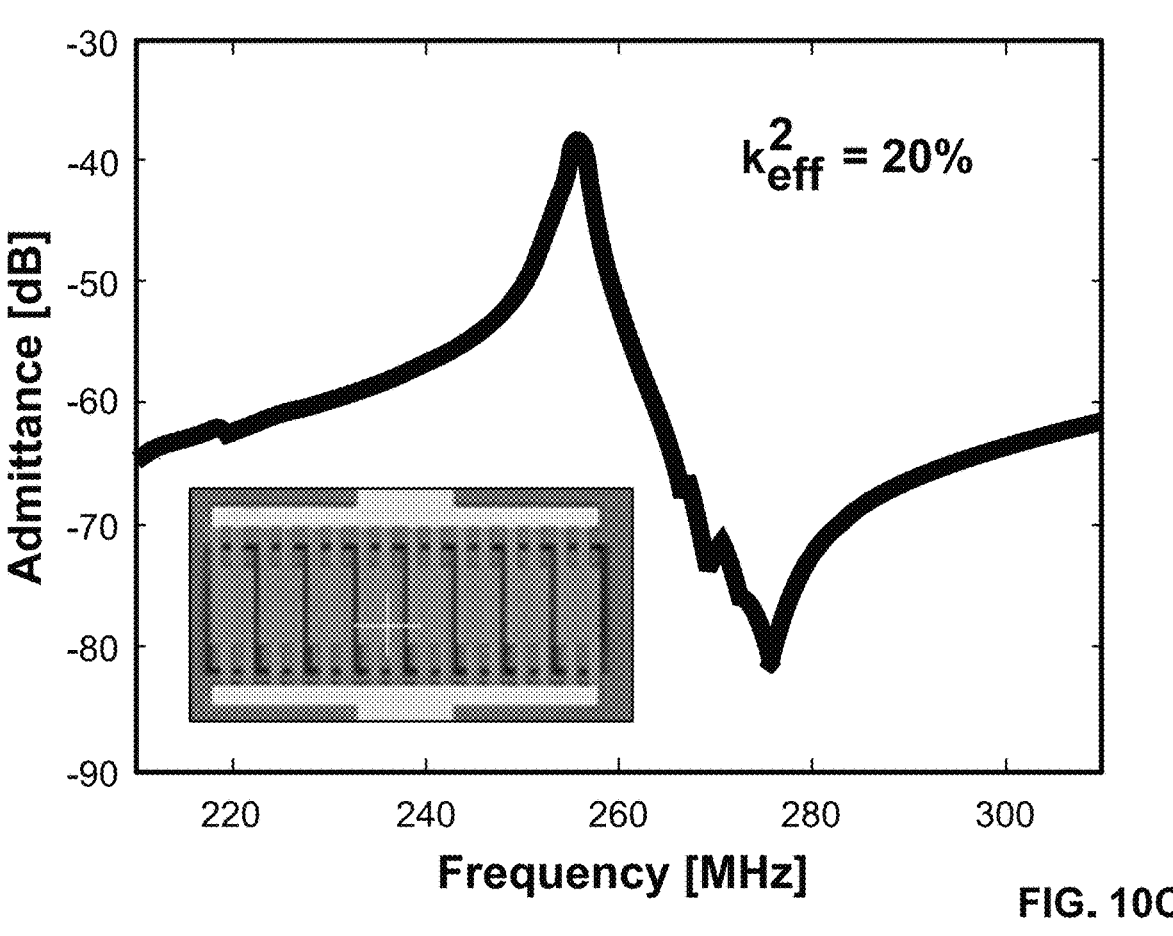

FIGS. 10A-10C illustrate the response of a resonator with a high coupling wavelength. As illustrated in FIG. 10A, split-finger IDTs reduce the spurious response of a LN resonator. Spurious resonances are also eliminated for this wavelength by minimizing the width of a single resonator, as illustrated in FIG. 10B. As a result of these optimizations, a relatively spur free response is achieved with a high electromechanical coupling coefficient $$K_t^2$$

of 20%, as illustrated in FIG. 10C, with the inset in FIG. 10C being a micrograph of the resonator.

Figure 11A:
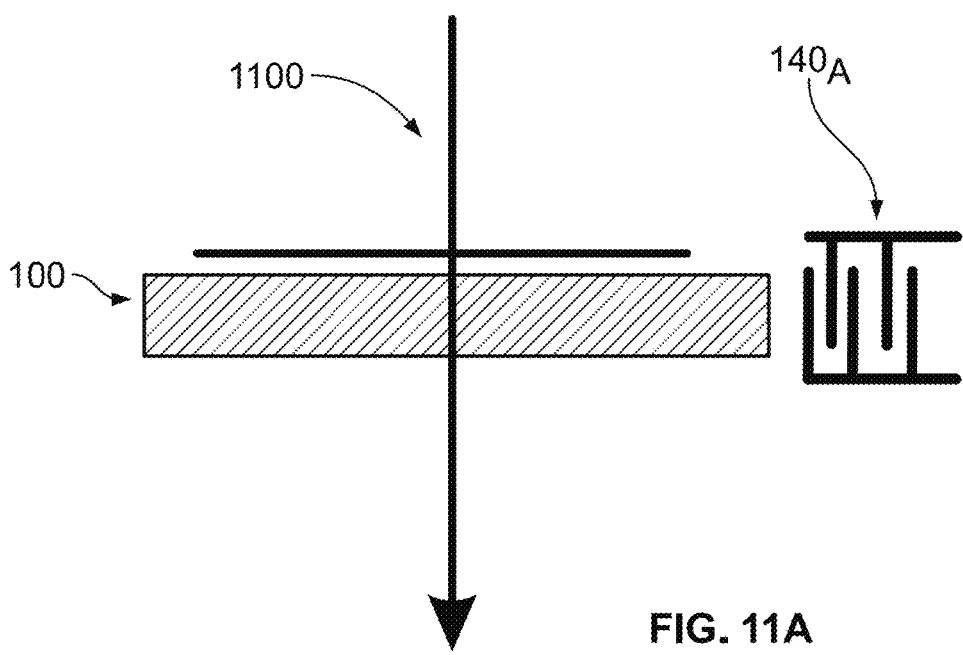
FIGS. 11A and 11B illustrate the interaction of a light beam with a reconfigurable metasurface device in accordance with one or more embodiments of the present invention when the device is off and on, respectively.
Figure 11B:
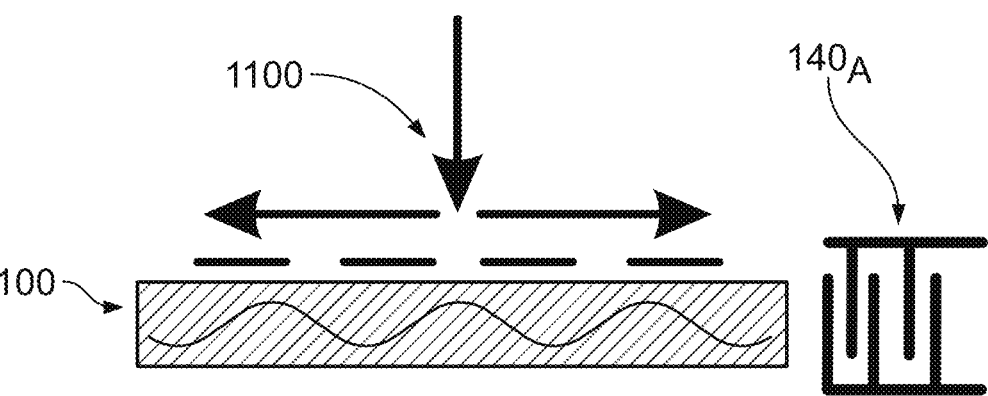
Figure 12A:
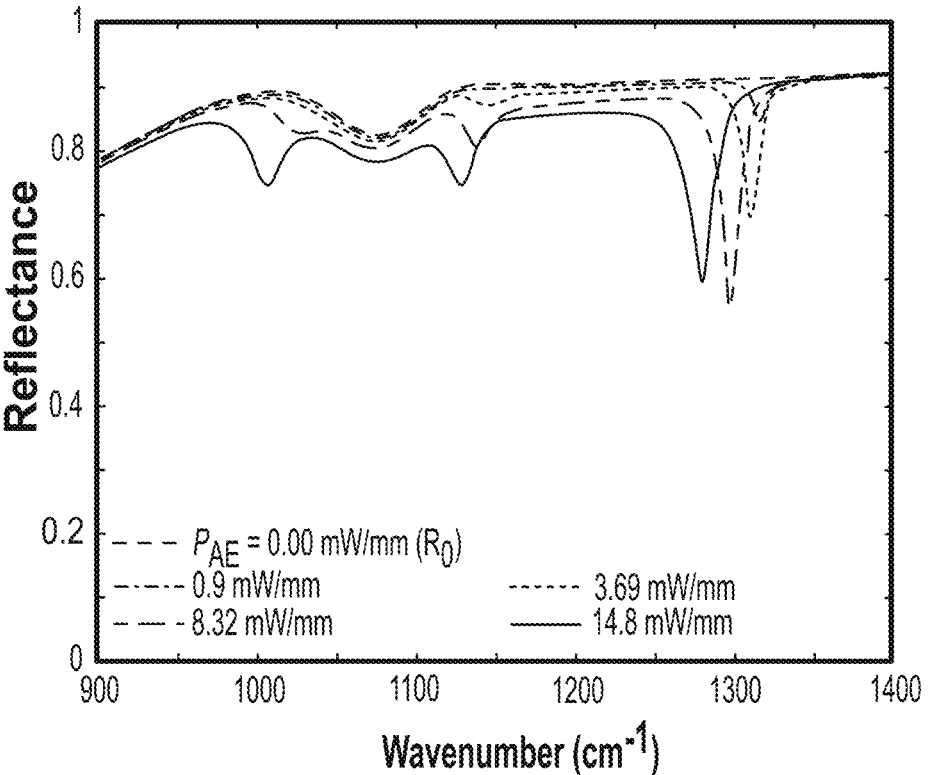
FIGS. 12A and 12B illustrate the simulated response as a function of modulation for a reconfigurable metasurface device in accordance with one or more embodiments of the present invention.
Figure 12B:
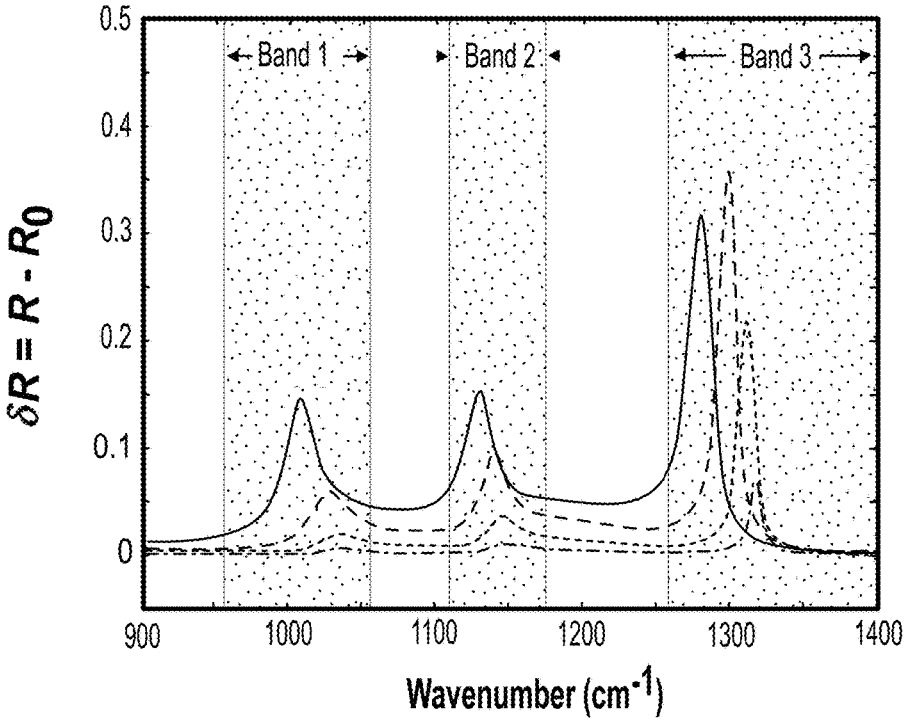

FIGS. 11A and 11B illustrate operation of the reconfigurable metasurface device 100 as a single pass optical modulator. As illustrated in FIG. 11A, when no RF signal is applied to the IDT 140$_A$, an optical signal 1100 passes through the reconfigurable metasurface device 100. In contrast, when an RF signal is applied to the IDT 140$_A$, a portion of the optical signal 1100 is scattered by the RF signal induced grating, with the scattered light being coupled to, and absorbed by, the plasmon mode in thin film semiconductor layer 130, with the remainder passing through the reconfigurable metasurface device 100. FIGS. 12A and 12B illustrate the simulated response of the reconfigurable metasurface device 100 at different modulation levels. Using the same device parameters as those employed in the simulation illustrated in FIG. 4, the change in reflectivity (ΔR/R) of the reconfigurable metasurface device 100 is shown to be a strong function of both the modulation percent of the charge density in thin film semiconductor layer 130 and the wavenumber, with the change in reflectivity being a measure of the absorption by the plasmon mode in thin film semiconductor layer 130. As illustrated in FIGS. 12A and 12B, the reconfigurable metasurface device 100 can provide as much as a 0.3 change in reflectivity (δR=R−R$_0$). As shown in FIGS. 12A and 12B, a change in modulation can also tune the wavelength of the change in reflectivity by over 50 cm$^{-1}$ (~0.3 µm).

Figure 13A:
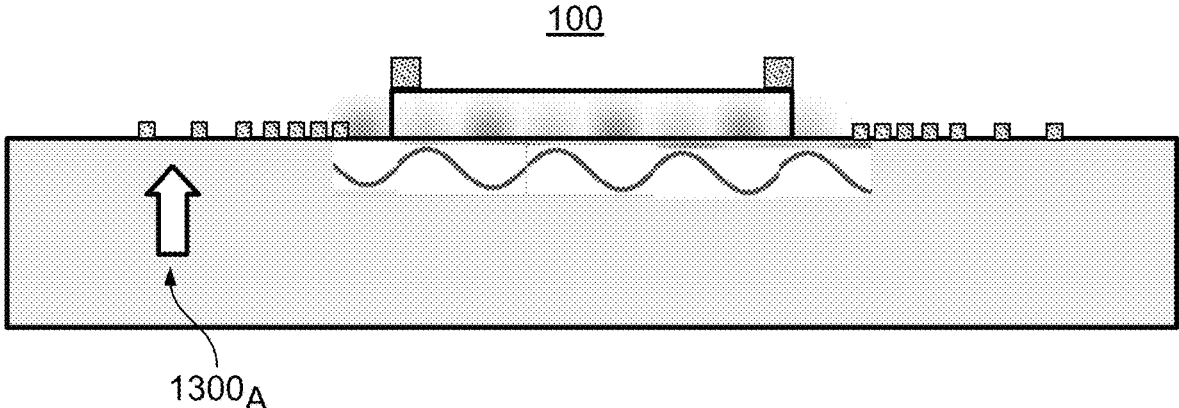
FIGS. 13A and 13B illustrate the operating principles of a reconfigurable metasurface device in accordance with one or more embodiments of the present invention when operated at different frequencies.
Figure 13B:
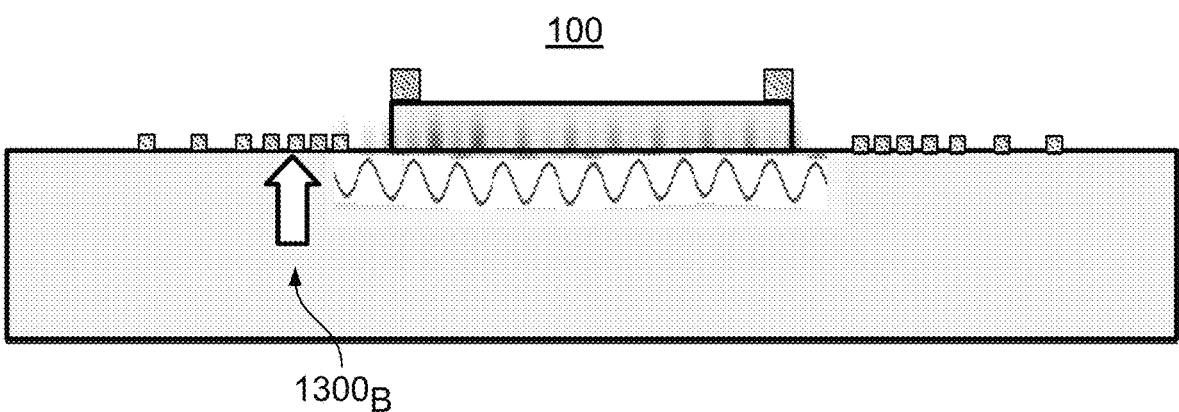

While the wavenumber response can be tuned by changing the modulation percent as illustrated in FIGS. 12A and 12B, the response of the reconfigurable metasurface device 100 can also be changed by changing the frequency of the applied RF signal. As illustrated in FIGS. 13A and 13B, by changing the frequency of the applied RF signal, the period of the SAW 200 changes, inducing corresponding changes in the period of the strain wave and the electric field 210. These changes in the period of the electric field 210 ultimately manifest themselves as changes in the period of the ribbons of charge carriers 230 formed in the thin film semiconductor layer 130, i.e., changes in the grating formed by the ribbons of charge carriers 230. Note that the arrows 1300A, 1300B in FIGS. 13A and 13B indicate where within the IDT 140$_A$ the RF signal will match the chirped period of the fingers that form the IDT 140$_A$.

Figure 14:
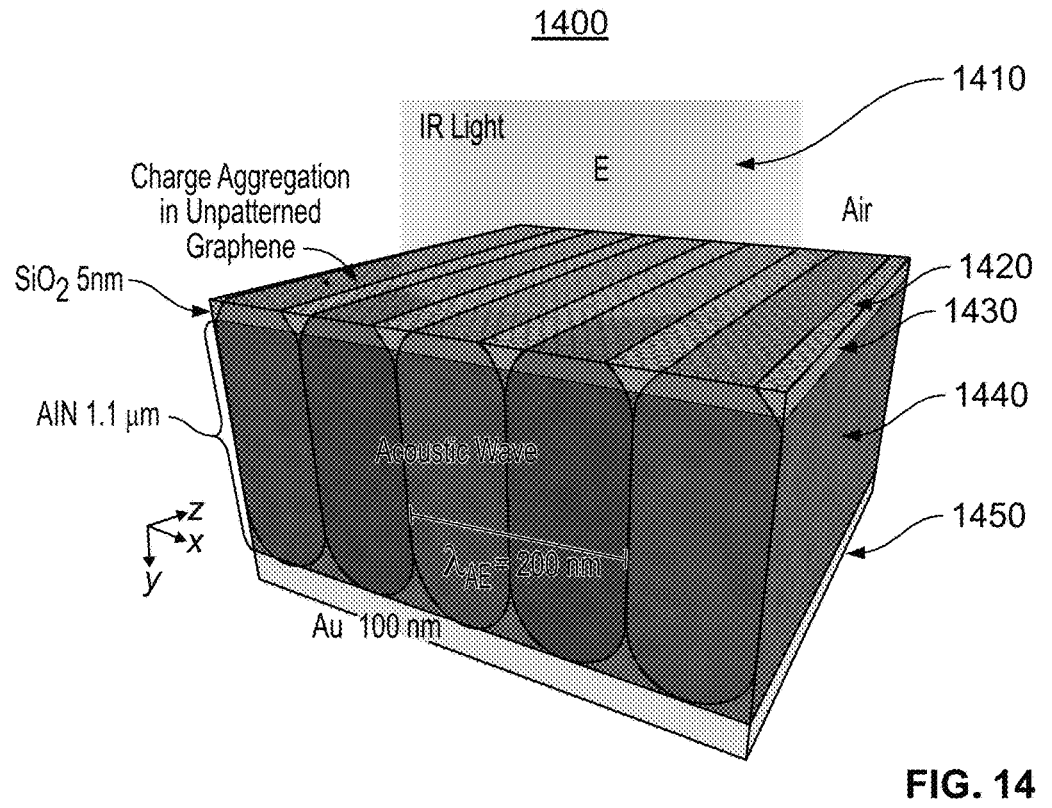
FIG. 14 illustrates a reconfigurable metasurface device operated as a resonant cavity-based optical modulator in accordance with one or more embodiments of the present invention.

FIG. 14 illustrates a reconfigurable metasurface device 1400 operated as a resonant cavity-based optical modulator. As illustrated in FIG. 14, an optical signal 1410 is incident on a top surface of the reconfigurable metasurface device 1400 and passes through a thin film semiconductor layer 1420 formed, for example, of graphene, to a buffer layer 1430 formed, for example, of SiO$_2$, and then to a piezoelectric substrate 1440. The piezoelectric substrate 1440 is formed, for example, of AlN, which is transparent to an optical signal 1410 in the MWIR. The bottom surface of the piezoelectric substrate 1440 is covered with a reflector 1450 formed, for example, of gold (Au), to reflect the optical signal 1410. When no RF signal is applied to the IDT (not illustrated) of the reconfigurable metasurface device 1400, the optical signal 1410 will pass back out of the reconfigurable metasurface device 1400 after being reflected by the reflector 1450. This corresponds to the "ON" state of the reconfigurable metasurface device 1400. In contrast, when an RF signal is applied to the IDT, the thin film semiconductor layer 1420 acts as a reflection grating, and the reconfigurable metasurface device 1400 becomes an optical resonator. When in the optical resonator state, the reconfigurable metasurface device 1400 traps, rather than reflects, the optical signal 1410. This corresponds to the "OFF" state of the reconfigurable metasurface device 1400.

As the thickness of the buffer layer 1430 is reduced toward 0, the plasmon tuning range (TR) steadily decreases to 100 cm$^{-1}$. In this case, the graphene plasmon mostly sees the high refractive index of the piezoelectric substrate 1440. Conversely, when the thickness of the buffer layer 1430 is increased to 50 nm (corresponding to λ$_p$/4), the TR approaches its maximum value of 384 cm$^{-1}$. However, a thick buffer layer 1430 on top of the piezoelectric substrate 1440 negatively impacts performance of the overall reconfigurable metasurface device 1400 by both reducing acoustoelectric coupling between the thin film semiconductor layer 1420 and the piezoelectric substrate 1440, as well as allowing acoustic energy to leak out of the piezoelectric substrate 1440 into the buffer layer 1430. To this end, a conservative 5 nm was selected as the thickness of the buffer layer 1430. With this thin buffer layer 1430, the plasmonic response was optimized by selecting a thickness of the piezoelectric substrate 1440 to create a quarter-wave cavity for the band 3 resonance (FIG. 12B). The band 3 resonance corresponds to 7.7 μm in vacuum, and for a piezoelectric substrate 1440 formed of AlN with a refractive index of approximately 1.7, the thickness of the piezoelectric substrate 1440 is 1.1 μm to create the desired quarter-wave cavity.

Performance of the reconfigurable metasurface device, especially in terms of required input RF power, can be improved over the device parameters used in the above discussed simulations. For example, the simulation used an electromechanical coupling coefficient $$K_t^2 = 5\%,$$

which would be typical if the reconfigurable metasurface device employed Raleigh SAW modes. This electromechanical coupling coefficient $$K_t^2$$

may be increased to as much as 20% if leaky SAW modes are employed. This would require changing the period of the IDT 140$_A$ (and the cut of the piezoelectric substrate 110 if a LiNbO$_3$ substrate is used). One may also use Lamb waves with a thin film of AlN or ScAlN suspended over a cavity. While the reconfigurable metasurface device 100 illustrated in FIG. 1 employed a bulk piezoelectric substrate 110 formed of LiNbO$_3$, the use of a thin film of LiNbO$_3$ suspended over a cavity would concentrate the SAW as energy would not be lost to the bulk piezoelectric substrate 110. This change from a bulk piezoelectric substrate 110 to a thin film of piezoelectric material may increase the electromechanical coupling coerricient $$K_t^2$$

to as much as 40%.

As discussed above, the greater the mobility u of the charge carriers in the thin film semiconductor layer 130 the better. Assuming the thin film semiconductor layer 130 is formed of graphene, its mobility μ can potentially be significantly improved. The simulation of the reconfigurable metasurface device 100 assumed a mobility u that is representative of a polycrystalline graphene film. By using a single crystalline graphene film, the mobility μ may increase by a factor of 3-5×. A quality single crystalline graphene film may be grown using chemical vapor deposition (CVD). As the grown graphene film must be transferred to the surface of the piezoelectric substrate, improvements in this transfer process may result in a factor of 2-3× increase in the mobility μ. In addition, by encapsulating the graphene film in boron nitride (BN), the mobility μ may increase by a factor of 10×. For additional information regarding the growth and transfer of graphene films, see, for example, D. De Fazio et al., "High-Mobility, Wet-Transferred Graphene Grown by Chemical Vapor Deposition," ACS Nano, vol. 13, pp. 8926-8935 (2019), the contents of which are incorporated herein by reference.

Figure 15A:
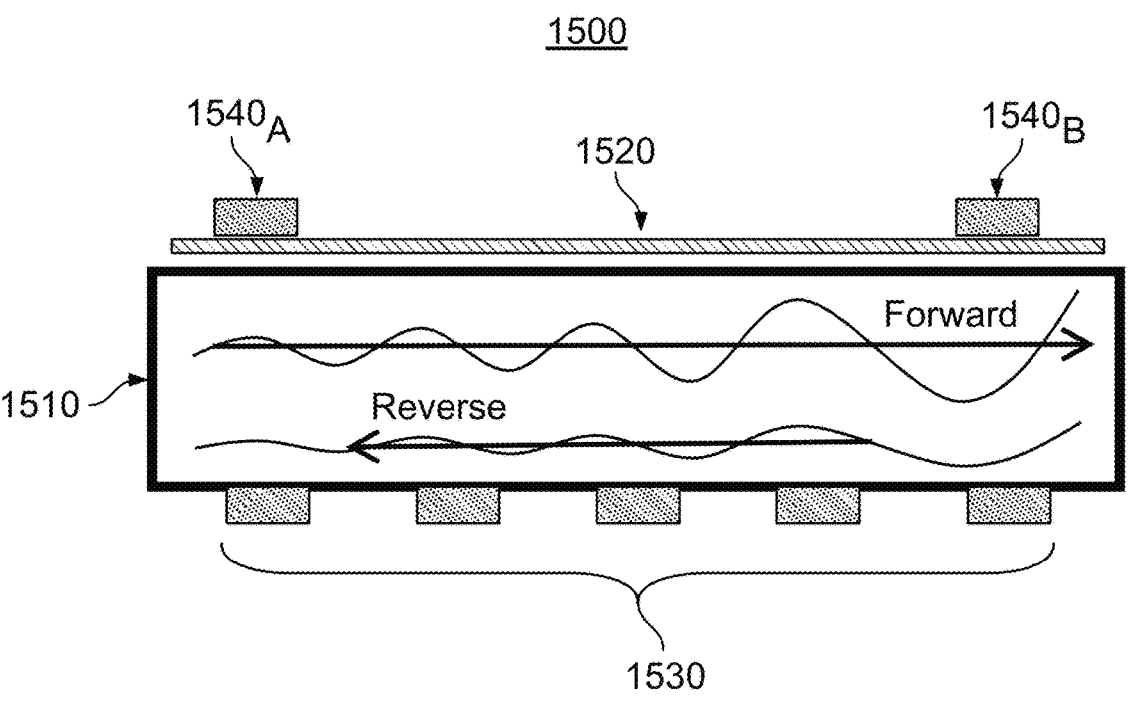
FIGS. 15A and 15B illustrate a reconfigurable metasurface device operated as an RF amplifier in accordance with one or more embodiments of the present invention and its simulated response, respectively.
Figure 15B:
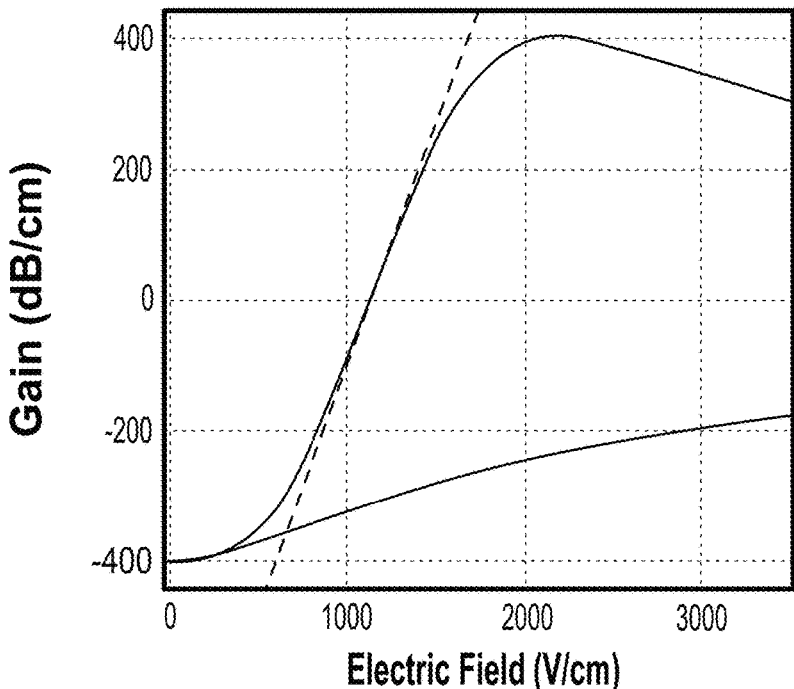

While the reconfigurable metasurface device 100 illustrated in FIG. 1 has been described as an optical device, a closely related device may also act as an RF amplifier 1500, with the structure illustrated in FIG. 15A. The RF amplifier 1500 uses a Lamé mode in the piezoelectric substrate 1510, formed, for example, of AlN, coupled to 2DEG in the thin film semiconductor layer 1520, formed, for example, of a GaAs quantum well. Lamé mode is a hybrid of a film bulk acoustic resonator (FBAR) mode and a plate mode and marries the large coupling coefficient of FBAR modes with the mode selectivity of Lamb-wave resonators, thus avoiding Q-loss due to spurious mode coupling. Furthermore, low density 2DEGs are well suited to have plasmon resonances in the low THz approaching the 10-100 GHz range. Additionally, 2DEG systems on low index dielectric can exhibit coupling to LO and TO phonons, resulting in phonon-plasmon-polaritons. The RF amplifier 1500 uses a bottom IDT 1530 as an input/output port, along with a pair of bias electrodes 1540A, 1540B on the surface of the thin film semiconductor layer 1520. The forward wave experiences more gain than the backward gain resulting in net gain per round trip, making steady state oscillation possible if the total gain is greater than the total loss, as illustrated in the modeled gain curves of FIG. 15B. Below threshold, this device can operate as a filter with Q-enhancement and with a tunable resonant frequency. Above threshold, the device becomes an oscillator. Additionally, the plasmon-mode coupling allows this device to operate as a sensor via the electric field associated with the plasmon mode.

With the goal of W-Band operation, the frequency scaling behavior of graphene and a thin film of LN is attractive. The reason for W-Band operation is that the bandwidth for the acoustoelectric effect is set by the Debye length. A higher carrier density decreases the Debye length and pushes the frequency response of the carrier aggregation into the 100 GHz regime. The corresponding decrease in electromechanical coupling coefficient $$K_t^2$$

is compensated for by the improvement in materials. Advantageously, W-Band operation opens the possibility of directly changing the plasmon dispersion, as 100 GHz phonons have a 34 nm wavelength in LN, which is a length scale that could impact the plasma dispersion.

Figure 16:
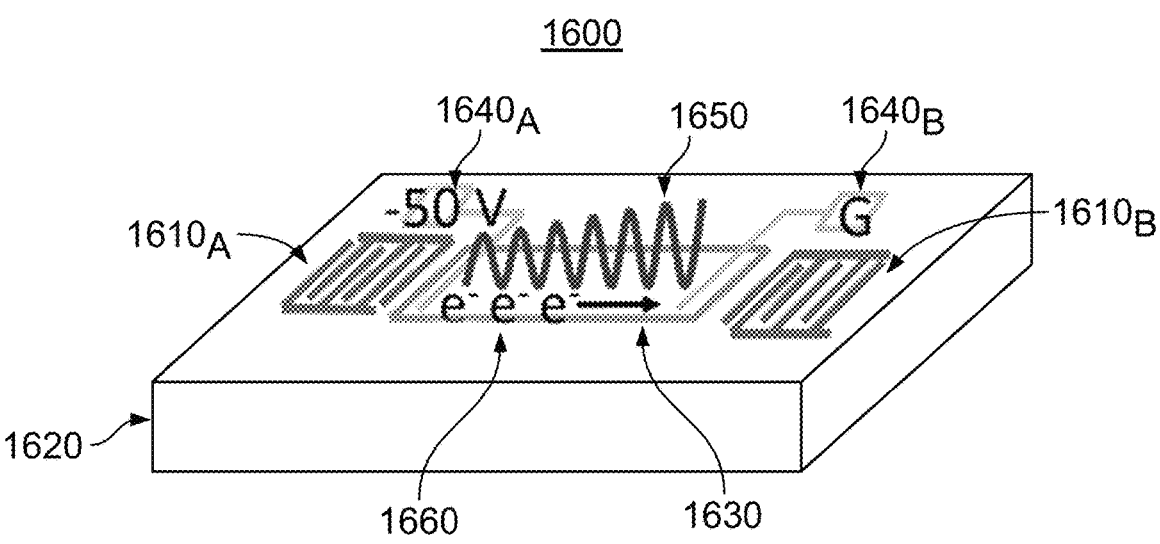
FIG. 16 illustrates another reconfigurable metasurface device operated as an RF amplifier in accordance with one or more embodiments of the present invention.

FIG. 16 illustrates the design of yet another RF amplifier 1600. Unlike the RF amplifier 1500 illustrated in FIG. 15A, RF amplifier 1600 employs a pair of IDTs 1610A, 1610B that are located on the top surface of the piezoelectric substrate 1620. A thin film semiconductor layer 1630 with a corresponding pair of bias electrodes 1640A, 1640B are likewise located on the top surface of the piezoelectric substrate 1620. To achieve gain of the signal 1650, biases of, for example, −50 V and ground are applied to the bias electrodes 1640A, 1640B, respectively. As illustrated, the ribbons of charge carriers 1660 move from left to right.

Figure 17A:
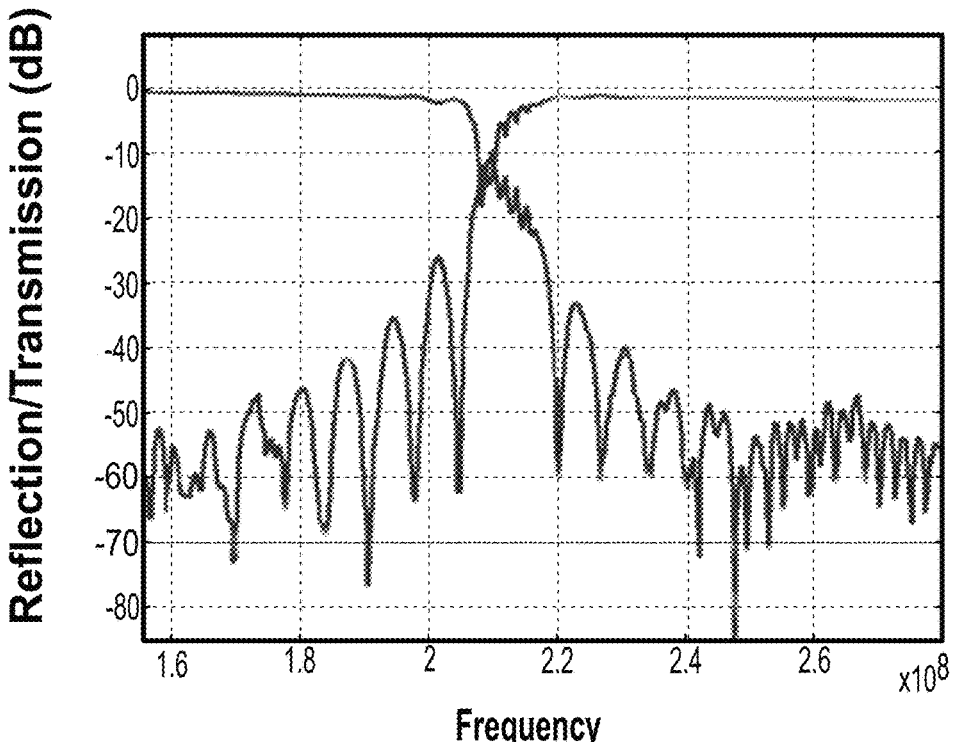

FIG. 17A illustrates the measured RF transmission and reflection for an RF amplifier similar to that of RF amplifier 1600, in which the graphene carrier mobility was approximately 470 cm²/V-s and the charge density was 0.6e12 cm⁻².

Figure 17B:
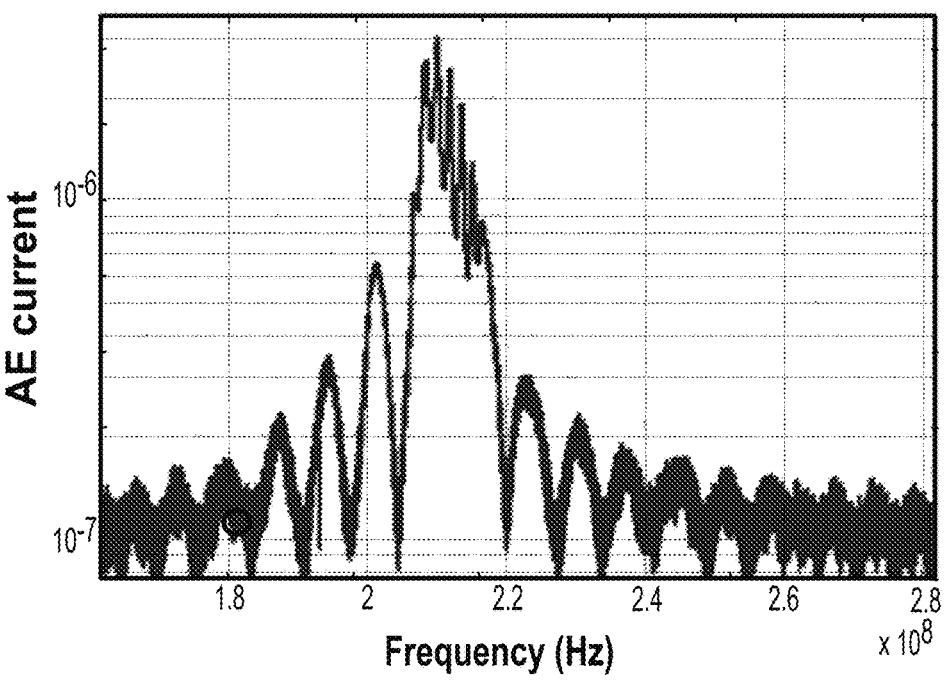
FIG. 17B illustrates the measured corresponding induced acoustoelectric current.
Figure 18:
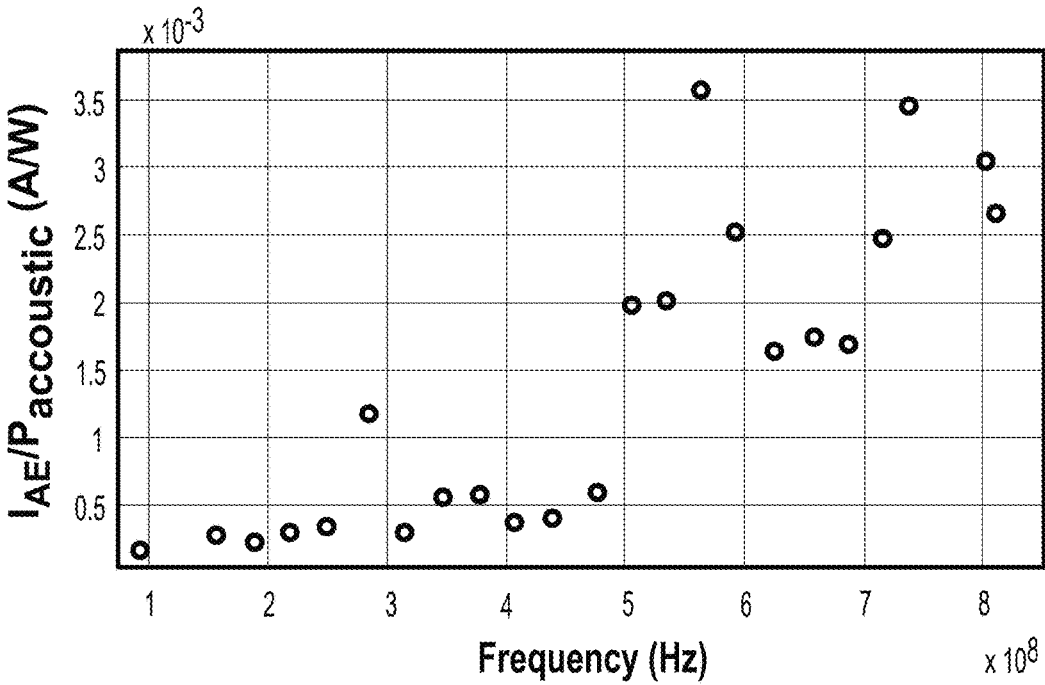
FIG. 18 illustrates the frequency scaling for an RF amplifier in accordance with one or more embodiments of the present invention.

FIG. 17B illustrates the measured induced acoustoelectric current $I_{AE}$, which, as expected, closely tracks the RF transmission. FIG. 18 illustrates the frequency scaling for the same RF amplifier. Specifically, as the frequency increases, the ratio of the acoustoelectric current $I_{AE}$ to the acoustic power $P_{acoustic}$ likewise increases.

Figure 19A:
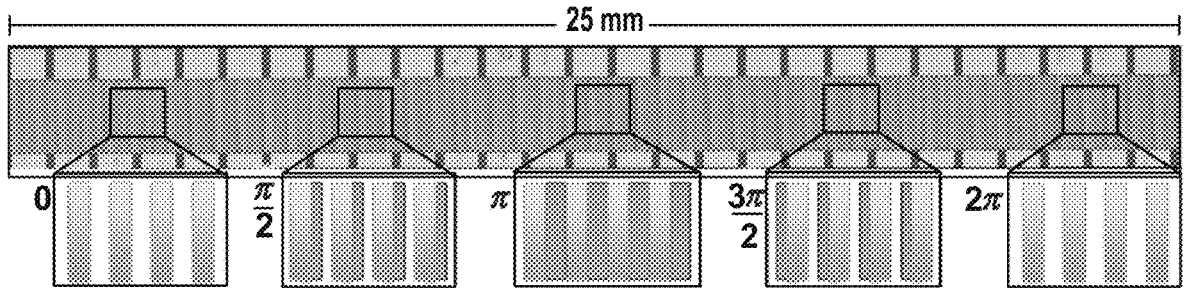
FIGS. 19A-19E illustrate a series of devices in accordance with one or more embodiments of the present invention that incorporate a Moiré pattern and their corresponding modeled and measured operating parameters.
Figure 19B:
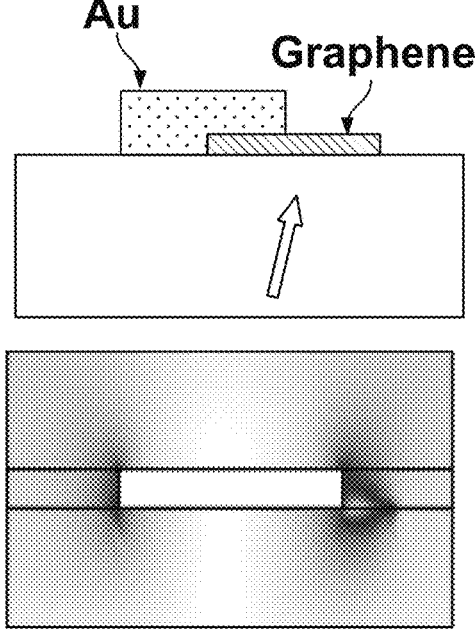
Figure 19C:
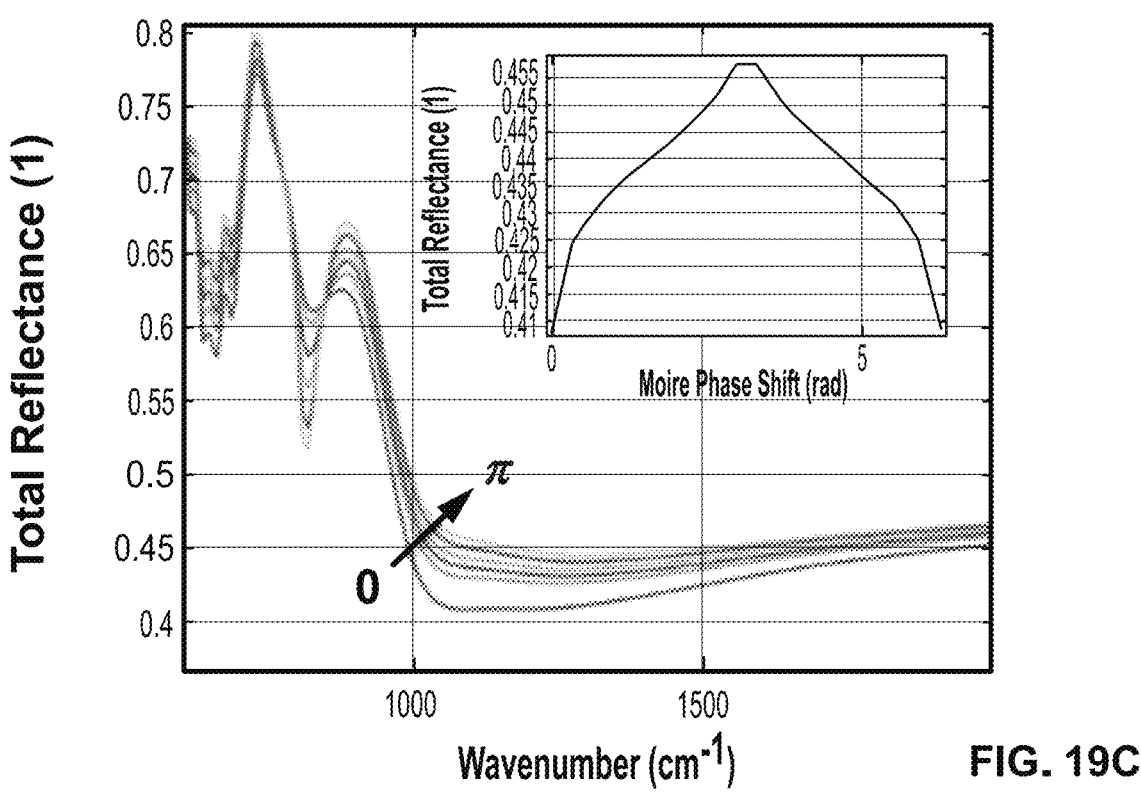
Figure 19D:
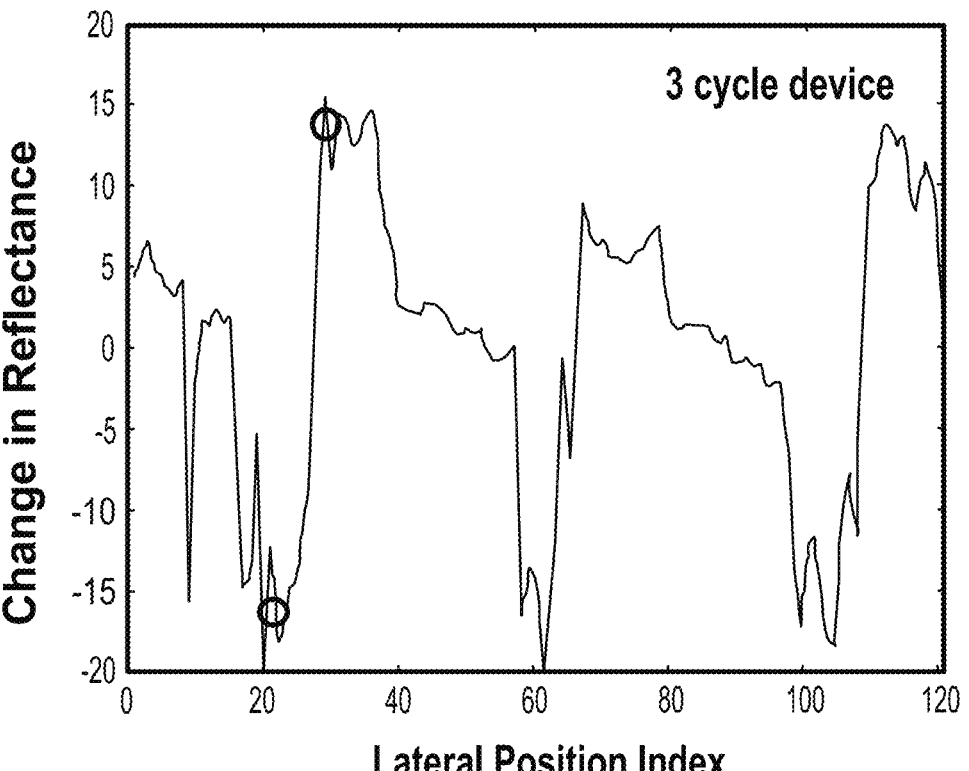

Devices in accordance with one or more embodiments were fabricated to create a plasmonic response in graphene utilizing a Moiré pattern fabricated via photolithography. A micrograph of the resulting device is illustrated in FIG. 19A. To achieve this, the graphene transferred to a LN coupon was patterned into microribbons with a 2 μm period. An Au grating was overlaid onto of the graphene microribbons with a slightly shorter period. By adjusting the periodicity of the Au grating, the "walk-off" between the patterns could be varied. For example, given a Moiré phase of 0 rad. (corresponding to the periodicity of the walk off), the graphene and Au grating would be perfectly on top of each other, while at π rad., the patterns would be perfectly separated. The interesting Moiré phases are between 0 and π rad., where regions of graphene drop into the submicron region as the overlapped region is necessarily shorted out. When such intermediate Moiré regions are exposed to normally incident IR illumination, the sub-micron patterning results in plasmonic excitation in the graphene, as illustrated in FIG. 19B. The lower inset to FIG. 19B illustrates the simulated field distribution for a small nonoverlapping region enabling plasmonic coupling to the graphene. This localized absorption in the graphene results in strong modification of the IR reflectance as shown in the simulation results illustrated in FIG. 19C. Although the response is not especially narrow, due to intrinsic optical loss in the LN, it still exhibits plasmonic field profiles that make the monolayer graphene much more optically active leading to nearly 10% modification in reflectance within the Reststrahlen band of the LN. Experimental demonstration of the Moiré plasmonic effect produced infrared spectra at two locations (denoted by the two dots in FIG. 19D), which vary by up to 20% as the IR measurement is stepped along the Moiré pattern.

Figure 19E:
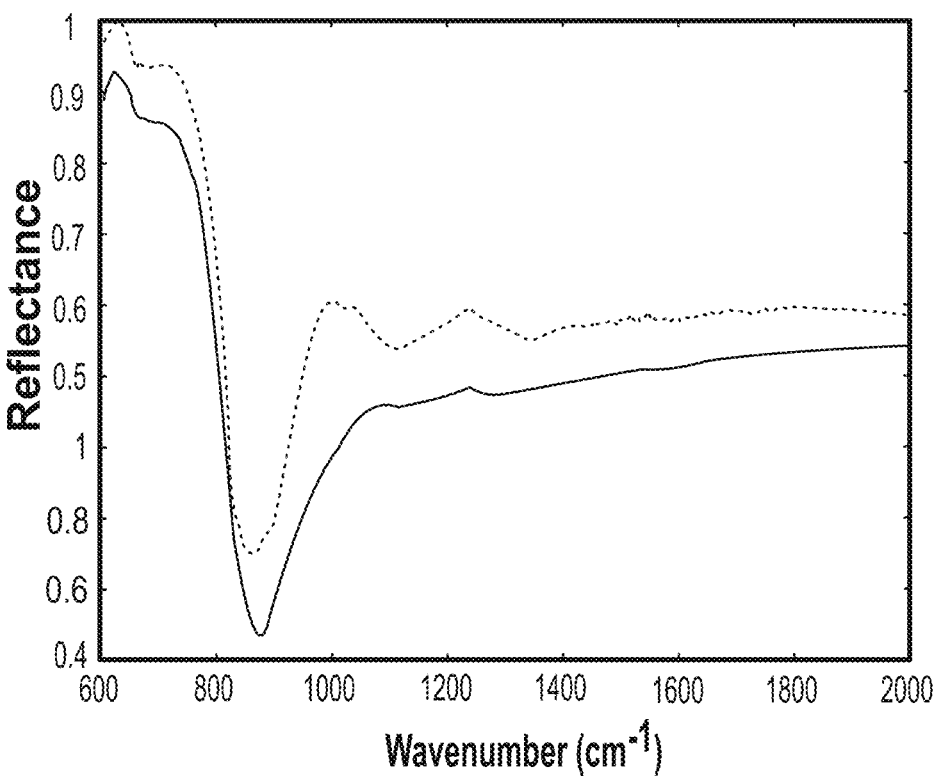

To further investigate the Moiré pattern for graphene plasmonic excitation via photolithography, an FTIR microscope was automated to collect IR spectra along the length of the Moiré pattern. While each measurement is obtained from a 200 by 200 μm square, the Moiré pattern extends for 1 inch laterally such that at each test position, the walk-off of the graphene from the Au grating can be considered constant. The plot in FIG. 19E illustrates example spectra of two locations on the Moiré pattern. While not identical to the computation (because the exact optical properties of the LN coupon were not used), similar trends are observed. Namely the majority of the response exists on the red shifted side of the Reststrahlen band around 1000 cm⁻¹. The two spectra are representative for the locations illustrated on the plot of FIG. 19D. This device was designed to contain three cycles, meaning the difference in periodicity between the Au grating and graphene microribbons was selected such that the walk-off would happen three times within the 1-inch length Moiré pattern. As expected, three reflectance fringes exist taken from the dip in the spectra around a wavenumber of 875 cm⁻¹. Since the only physical variation that exists on this spatial periodicity is the walk-off between the Au grating and graphene microribbons, the graphene must be interacting with IR light. Furthermore, since graphene's intrinsic absorption in the infrared (i.e., without plasmonic excitation) is only a couple percentage points at best, this response of more than 10% must result from plasmon enhanced absorption in graphene.

Figure 20A:
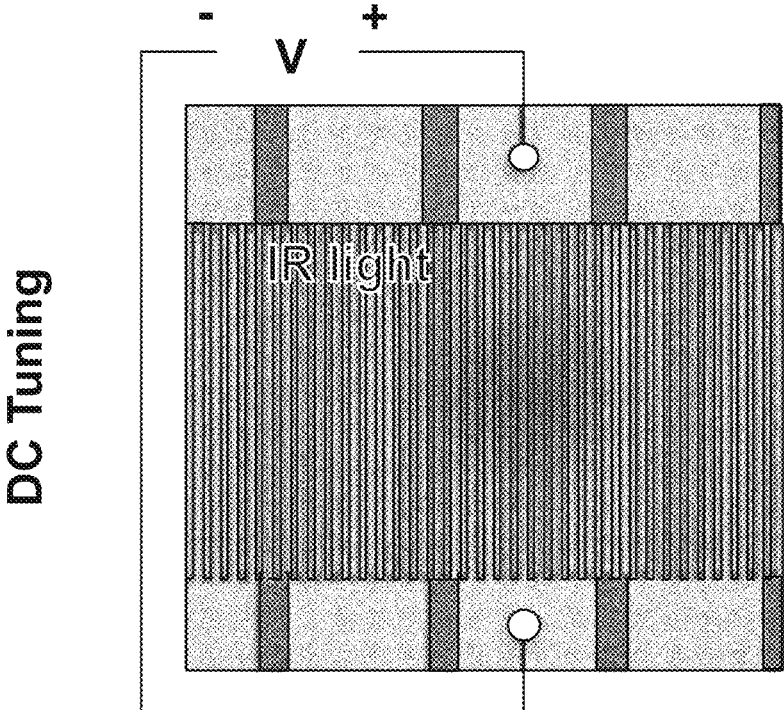
FIGS. 20A-20F illustrate a device in accordance with one or more embodiments of the present invention operating with a DC bias (FIGS. 20A-20C) and an RF bias (FIGS. 20D-20F) and its corresponding measured operating parameters.
Figure 20B:
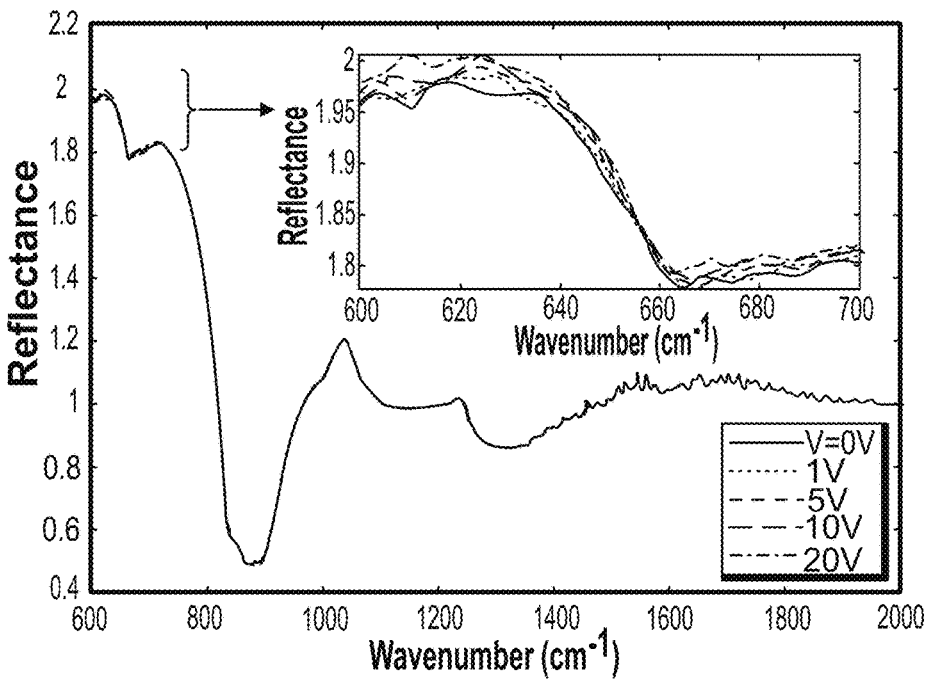
Figure 20C:
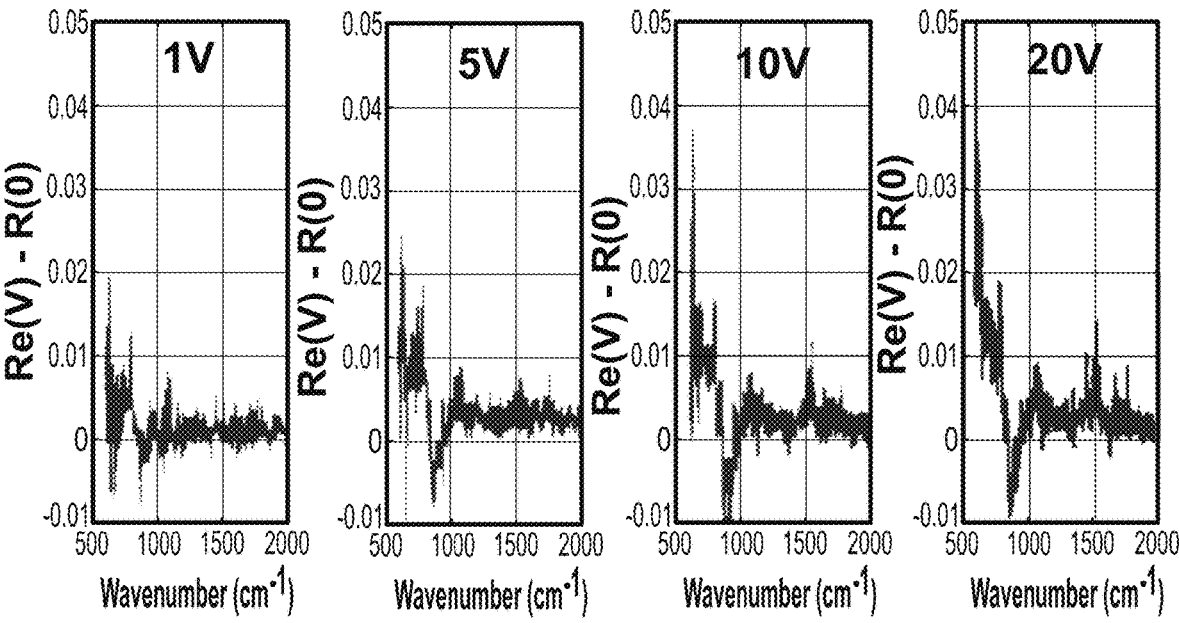
Figure 20D:
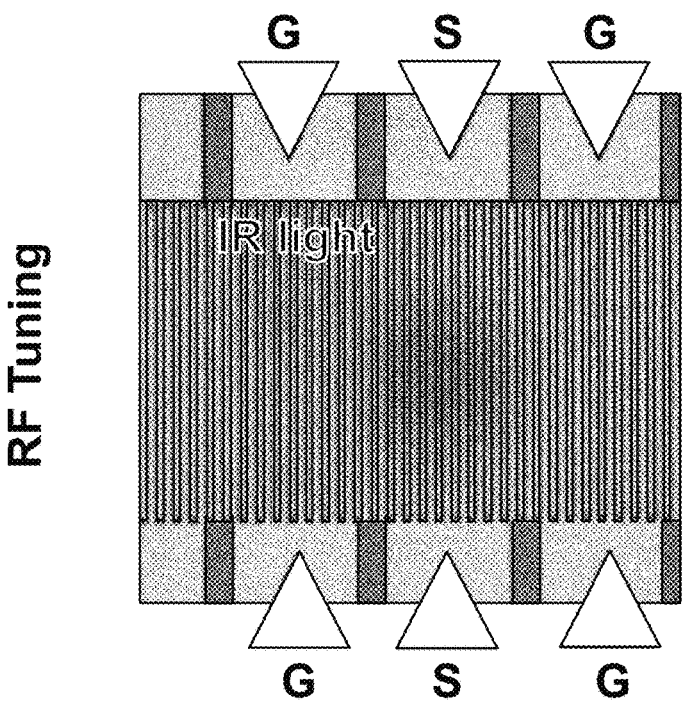

Another aspect of the Moiré test pattern is that the Au grating used to short-out the graphene regions into sub-micron features is designed to be electrically driven as an IDT, as illustrated by the large Au pads in FIG. 19A. This allows two novel measurements to be performed. First, DC voltage tuning can be created using static electric fields between the IDT fingers that interact with the graphene as illustrated in FIG. 20A. The second test demonstrated acoustoelectric tuning by applying a 400 MHz RF signal through the center device, which is confined by neighboring devices that behave as Bragg reflectors, as illustrated in FIG. 20D. (FIGS. 20A and 20D clearly illustrate how the Au grating can behave as an IDT.) In these measurements, the IR light was fixed at one position and its spectra measured as a function of different input voltage signals. FIG. 20B illustrates the IR spectra as a function of DC bias voltages from 0 V to 20 V. While minimal impact to the response is observed across the whole spectra, when zooming into the Reststrahlen band region, noticeable modification is seen between spectra, on the order of 0.05%. Specifically, there is a monotonic change in the reflectance spectra in the region going from 0 V to 20 V. Plots of the difference reflectance spectra [R(V)–R(0V)] are illustrated in FIG. 20C to highlight the IR modification under different bias voltage conditions. At 1 V, minimal modification is observed, barely extending past the noise floor of the FTIR. As the applied voltage increases, the response becomes clearer, showing a dispersive behavior between 500 and 1000 cm⁻¹.

Figure 20E:
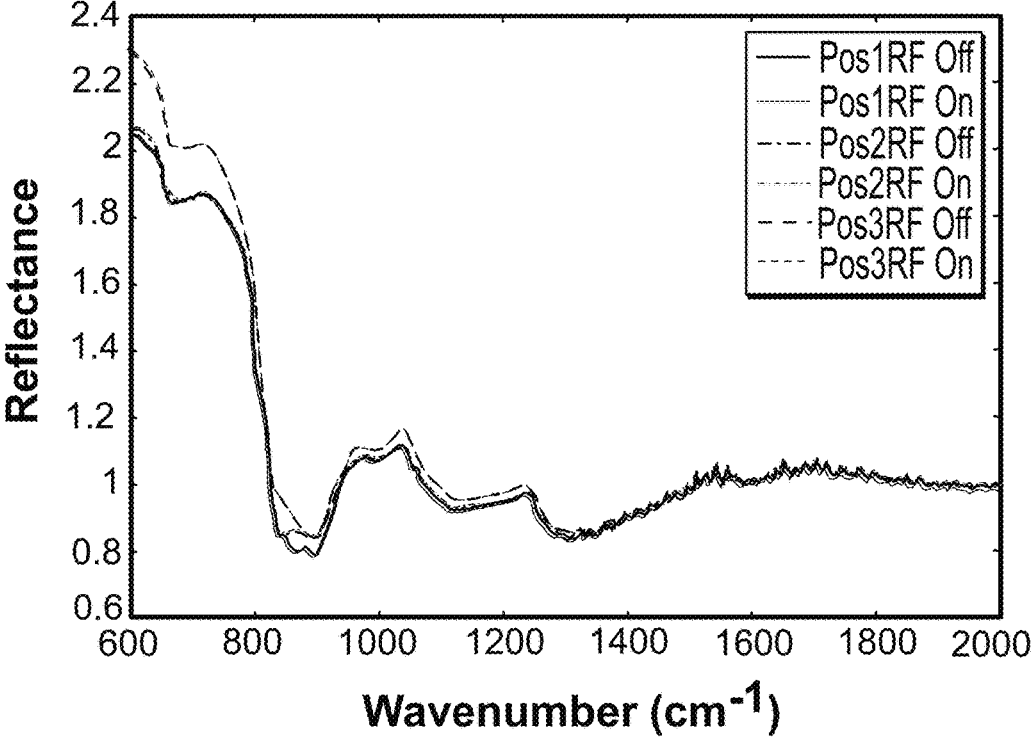
Figure 20F:
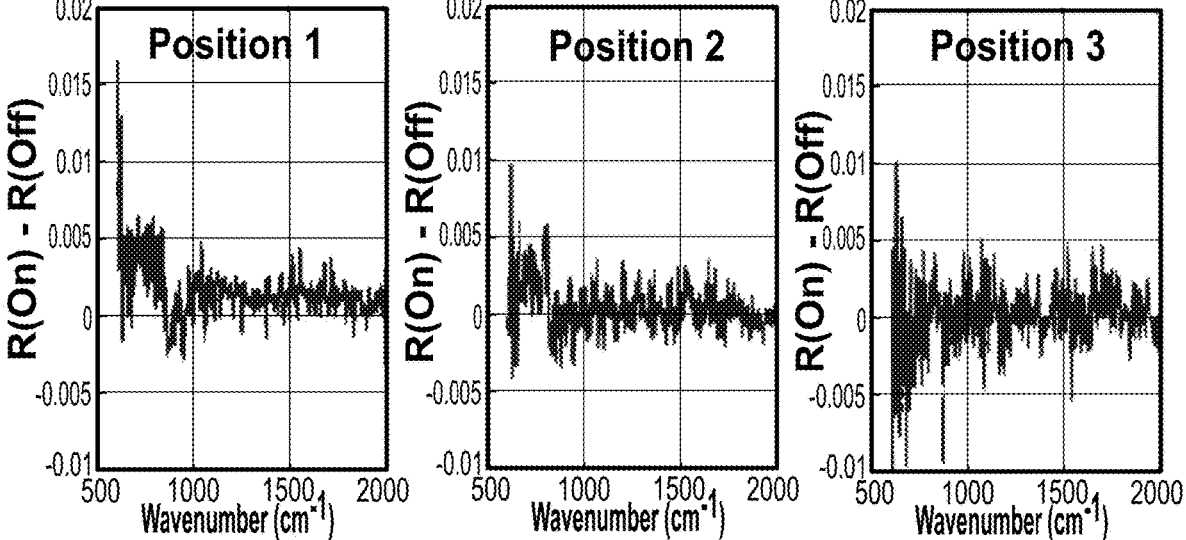

FIG. 20E illustrates the responses when the device was driven with the 400 MHz RF signal to see if its response could be modified with an acoustoelectric signal. For this measurement, optical spectra were collected with the RF signal on and off at three different positions on the Moiré structure. First, by comparing the three RF signal on curves, the impact of the Moiré walk-off on the spectra is evident. From the absolute curves illustrated in FIG. 20E, the difference between the RF on and the RF off states is difficult to observe. However, by plotting the difference spectra [R(RF On)–R(RF Off)], as illustrated in FIG. 20F, the impact of RF tuning becomes evident. In FIG. 20F, positions 1 and 2 reflect the impact of RF tuning, while position 3 shows virtually no RF tuning impact. This is important because if the impact from the RF signal on the IR spectra was through some parasitic effect, for example, heating or deformation, one would expect it to be constant at each location. However, since there is variation, this would imply that certain regions of the Moiré pattern are more tunable, which is expected due to the varying design of the graphene regions. This response is expected to be improved upon by separating the graphene from the LN with a lossless buffer layer that prevents attenuation of the graphene plasmon by the substrate.

Devices in accordance with one or more embodiments can be fabricated by any acceptable process. The following describes the processes employed to fabricate the devices described and characterized above. As will be appreciated by those of skill, numerous variations on the following baseline device microfabrication process are possible and may be required for any particular combination of tools.

While the ultimate devices will employ high frequency RF diving signals, development of both the high coupling coefficient graphene transfer and the graphene-piezoelectric process involving patterning of metal and graphene was undertaken for use of low frequency RF driving signals as a baseline process. One challenge when working with graphene is to maintain its quality during processing. In general, graphene quality is degraded when it is in contact with photoresist. Furthermore, graphene can adhere to and degrade performance of the IDTs required for RF to acoustic transduction. Overcoming these challenges required developing a "pre-etch" step where PMMA was used to protect the graphene from subsequent photoresist and lithography steps and developing an IDT first process that included protecting the IDTs from subsequent steps involving graphene.

The baseline device microfabrication process was developed for the generation of graphene-based acoustoelectric devices employing a LN piezoelectric substrate. Key to the development of functional devices was a pre-etch step, which prevented contact delamination for improved yield. Following the pre-etch step, gold contacts are deposited through e-beam evaporation and a $HfO_2$ passivation is performed to protect the graphene from atmospheric exposure. In this process development, the IDTs are integrated at the back-end of the process flow, and a passivation etch occurs to allow for IDT contact to the LN substrate. The process flow is illustrated in summary form in FIG. 21.

The steps of the baseline device microfabrication process include:

Dicing an XY 128 LN substrate into 25×20 mm coupons, with the wafer flat parallel to the long side. (Orientation of the coupons is important as the generated SAW wave for optimal performance should be perpendicular to the wafer flat.)

Depositing alignment marks.

Cleaning and baking the LN substrate.

Transferring the graphene layer.

Performing the pre-etch step.

Depositing and pattering the contacts.

Passivating the contacts.

Etching the passivation.

Depositing and patterning the IDTs. (This IDT last process avoids contaminating the IDTs.)

In greater detail, the baseline device microfabrication process is as follows: LN coupons having a size of 25×20 mm are diced from a 4" wafer of 128° XY black LN (bLN) with the wafer flat parallel to the 25 mm side of the coupon. (bLN is LN that has been doped with carbon to allow for high processing temperatures and avoid substrate shattering, as typical wafers of LN are easily cracked due to temperature gradients.) It is necessary to maintain track of the wafer edge as the transducers are placed perpendicular to the wafer flat. This is because the surface acoustic mode excited long this crystalline direction yields a higher electromechanical coupling coefficient $$K_t^2.$$

Following the dicing, a LN coupon is prepared for alignment mark metallization using an $O_2$ plasma barrel asher at 200 W for 5 minutes or by soaking in an acetone bath for 5 minutes followed by an IPA bath for 5 minutes. Following the substrate cleaning, the LN coupon is coated with HMDS either through a spin coat (1 drop of HMDS at 3000 rpm) or baked on at 150° C. for 45 minutes in an HMDS oven. After HMDS preparation, photoresist is spun at 2000 rpm and soft baked at 110° C. for 90 seconds. The photoresist is then exposed and developed. Post-development, the coupon is placed into an e-beam evaporator for metallization. For alignment marks, an adhesion layer of 10 nm Ti and 2000 nm of Al may be used. Lift-off is performed by soaking the coupon in acetone for at least 2 hours, and preferably overnight. Following the acetone soak, the coupon is sprayed with an acetone gun and rinsed in IPA to dislodge any residual debris.

After deposition of the alignment marks, the coupon is prepared for a graphene 1-Touch wet transfer. First, the coupon is cleaned in an $O_2$ plasma barrel asher at 100 W for 5 minutes. The coupon is then annealed in a vacuum oven at 200° C. for four hours and cooled overnight. The coupon is sonicated in acetone for 10 minutes at room temperature and rinsed with IPA. The coupon is then cleaned again in an $O_2$ plasma barrel asher for 10 minutes at 300 W and immediately placed into an acetone bath. After the acetone bath, the coupon is moved into an IPA bath. The graphene sheet to be transferred consists of a graphene layer coated with PMMA on top of a piece of cleanroom paper. The PMMA/graphene stack is released from the paper onto the surface of DI water. The graphene is then transferred to the coupon under DI conditions and the coupon/graphene stack is left to dry for at least 2 hours. Following the drying, the coupon/graphene is vacuum annealed at 150° C. for one hour and cooled for at least 12 hours to promote full adhesion between the coupon and the graphene. Finally, the PMMA is removed from the graphene by soaking the coupon in acetone for at least 1 hour, in IPA for 10 minutes, and in a second IPA soak for 1 minute.

While the just described transfer process is a wet process, dry transfer processes are also possible. In particular, a wafer-scale dry transfer process provides the benefits of higher quality graphene and a more scalable process. The following wafer-scale dry transfer process has been demonstrated as an alternative to the wet transfer process. First, layer of graphene is grown on a Ge(110) substrate using CVD. Second, the Ge/graphene substrate is cleaned. Third, a transition metal adhesion layer is evaporated onto the cleaned Ge/graphene substrate. The transition metal is, for example, Cu, Ni, or Au, and the adhesion layer has a thickness of, for example, approximately 20 to 40 nm. Fourth, the Ge/graphene/transition metal substrate is coated with PMMA and soft-baked. Fifth, a thermal release tape (TRT) is applied to the Ge/graphene/transition metal/PMMA substrate. Sixth, the graphene/transition metal/PMMA/TRT layers are peeled from the Ge substrate. Seventh, the graphene/transition metal/PMMA/TRT layers are placed on the coupon and pressed using a wafer bonder. Eighth, the TRT is released using a hot plate and pulled off. Ninth, the PMMA layer is stripped with an $O_2$ plasma. Tenth, the transition metal adhesion layer is etched away, leaving the just the graphene on the coupon.

After transfer, the graphene is patterned through a pre-etch process. PMMA is spun on the coupon at 3000 rpm and soft-baked at 180° C. for 60 seconds and photoresist is spun on at 2000 rpm and baked at 110° C. for 90 seconds. The photoresist on the coupon is then exposed with the graphene pattern mask and developed while the PMMA resist remains. The coupon is then etched to remove the PMMA in an $O_2$ plasma barrel asher for 10 minutes at 300 W. After the first 10 minutes, the PMMA is inspected to see if it has cleared, and then etched again for at least an additional 5 minutes at 300 W. After confirmation of full PMMA removal, the patterned graphene is left protected by the photoresist. The photoresist is removed by soaking in acetone for at least 2 hours, IPA for 10 minutes, and a secondary IPA bath for 1 minute, such that the patterned graphene remains. This pre-etch step reduces the occurrence of contact delamination.

After the pre-etch patterning step, contacts are deposited to contact the graphene layer. This again employs HMDS and photoresist spin and bake steps. The photoresist is then patterned and developed. Metallization is performed using an e-beam evaporator with a 10 nm Ti adhesion layer followed for 100 nm of Au. Au is selected for the graphene contacts due to its high conductivity. After metallization, liftoff is performed by soaking for the coupon for at least 2 hours and gently spraying (≤30 psi) due to the presence of the graphene layer with an acetone spray gun and soaked in IPA for 10 minutes. Liftoff in acetone is important as graphene is incompatible with an NMP liftoff process.

Once the contacts to the graphene layer are placed, the coupon is passivated with $HfO_2$ to protect the graphene from atmosphere. Before the $HfO_2$ passivation layer can be grown, a thin layer (1.5 nm) of $Al_2O_3$ is deposited through e-beam evaporation to act as a seed-layer for the $HfO_2$ passivation layer growth. A thin layer of Al is deposited and then oxidized and immediately following this deposition, the coupon is moved to an ALD for $HfO_2$ growth at 200° C. The $HfO_2$ passivation layer is then patterned using a photoresist process followed by a chlorine etch to expose the LN surface so that IDTs can be deposited. Once the $HfO_2$ passivation layer is etched, the transducers are deposited using a photoresist process followed by an e-beam evaporation with a 10 nm Ti adhesion layer and 100 nm of Al. Following liftoff in acetone, the IDTs are cleaned through an $O_2$ plasma barrel ash at 100 W for 5 minutes.

The baseline device microfabrication process described above employs photolithography to pattern the IDTs. As also described above, operation at higher frequencies requires IDTs having linewidths that are to fine to produce with photolithography. The following describes a modified device microfabrication process that employs e-beam lithography to define the IDTs.

Figure 22:
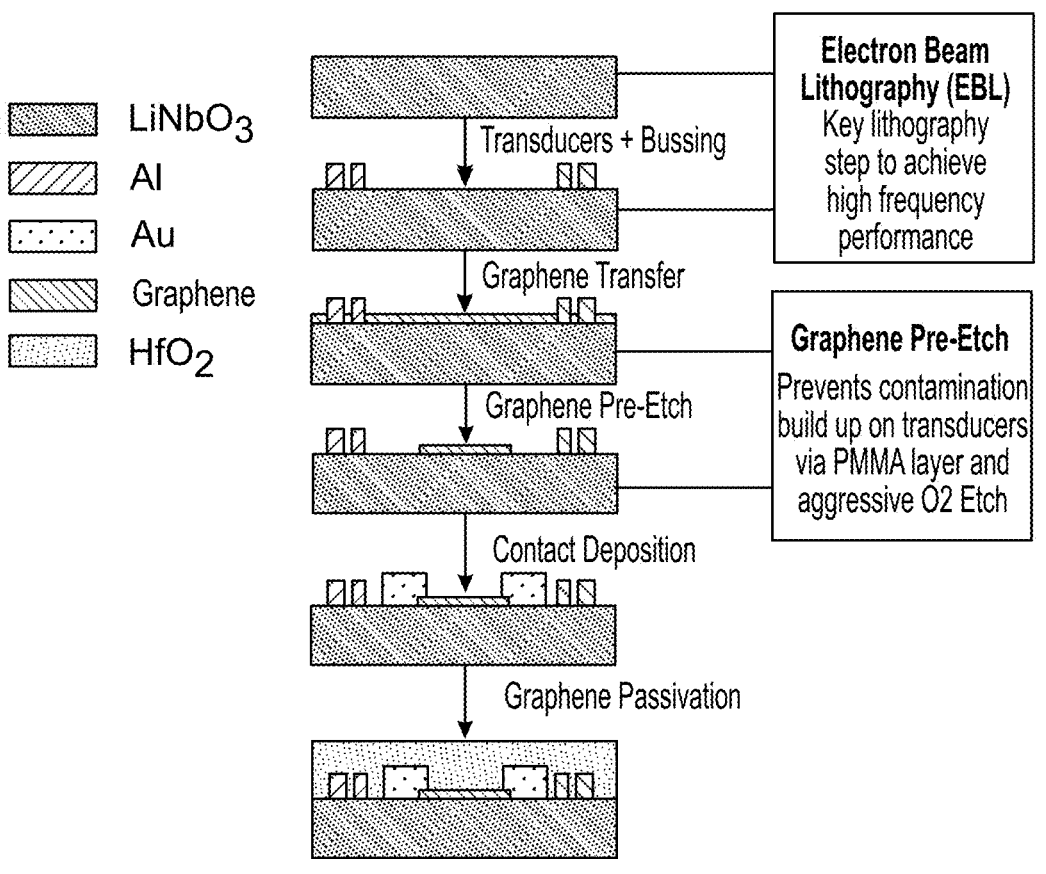
FIG. 22 illustrates an alternative process flow for fabricating a reconfigurable metasurface device in accordance with one or more embodiments of the present invention.

The e-beam lithography approach necessitates a transducer first process in which the IDTs are incorporated at the front end of the process. A front-end process required development of the pre-etch step as the graphene would leave the IDTs contaminated and the $O_2$ plasma barrel asher etch was insufficient to clean the remaining residue. Instead of the $O_2$ plasma barrel asher, another plasma etch was developed using a downstream plasma asher, which leverages a downstream plasma to more effectively and efficiently both etch the graphene and clean the IDTs. The remainder of the transducer first process is similar to that of the baseline device microfabrication process, with FIG. 22 illustrating the transducer first process flow in summary form.

While the above described baseline device microfabrication and transducer first processes employed LN coupons, both processes (with material-specific changes) have also been demonstrated using AlN as the piezoelectric material layer.

While the reconfigurable metasurface device 100 illustrated in FIG. 1 has been described as employing a traveling SAW 200, by applying RF signals to both IDTs $140_A$, $140_B$, or by applying an RF signal to only IDT $140_A$ while using IDT $140_B$ as a reflector, a standing SAW may be generated. A reconfigurable metasurface device employing a standing SAW may be useful in applications requiring greater power efficiency at the expense of reduced RF bandwidth.

Figure 23:
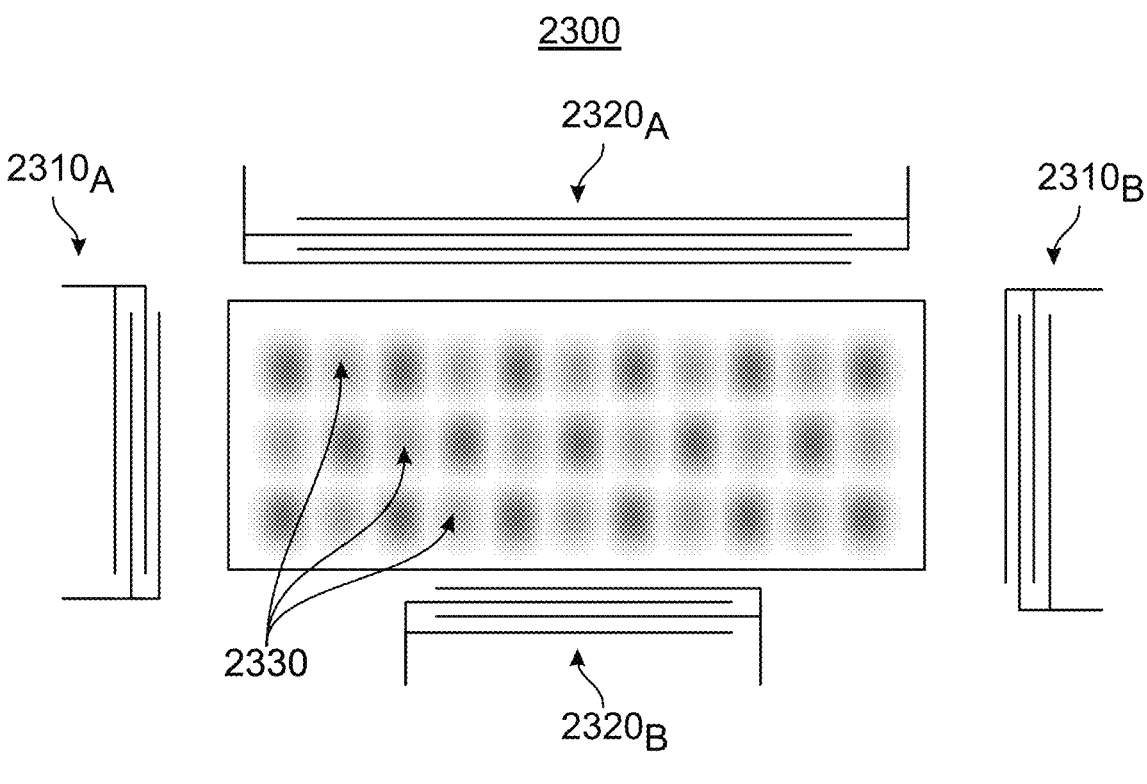
FIG. 23 illustrates a two-dimensional (2D) reconfigurable metasurface device in accordance with one or more embodiments of the present invention.

FIG. 23 illustrates an embodiment that is an extension of the reconfigurable metasurface device 100 illustrated in FIG. 1 from a one-dimensional (1D) reconfigurable metasurface device 100 to a two-dimensional (2D) reconfigurable metasurface device 2300. The 2D reconfigurable metasurface device employs at least two orthogonal IDTs $2310_A$, $2320_A$, and may include two pairs of orthogonal IDTs $2310_A$, $2310_B$, $2320_A$, $2320_B$ when a standing SAW is desired. As illustrated in FIG. 23, the charge carrier pattern is transformed from the ribbons of charge carriers 230 formed in the 1D reconfigurable metasurface device 100 into a 2D array of pockets of charge carriers 2330.

While FIG. 1 illustrates a reconfigurable metasurface device 100 having a single pair of opposing IDTs $140_A$, $140_B$ and FIG. 23 illustrates a 2D reconfigurable metasurface device 2300 having two pairs of opposing IDTs $2310_A$, $2310_B$, $2320_A$, $2320_B$, other embodiments may include even more pairs of opposing IDTs. For example, by using a circular or 2N-sided thin film semiconductor layer, one can place N pairs of opposing IDTs around the periphery of the circular or 2N-sided thin film semiconductor layer. The greater the number of opposing IDTs, the more spatial k-vectors that can be created, thereby allowing a greater diversity of charge patterns for custom metasurface device response.

Figure 24:
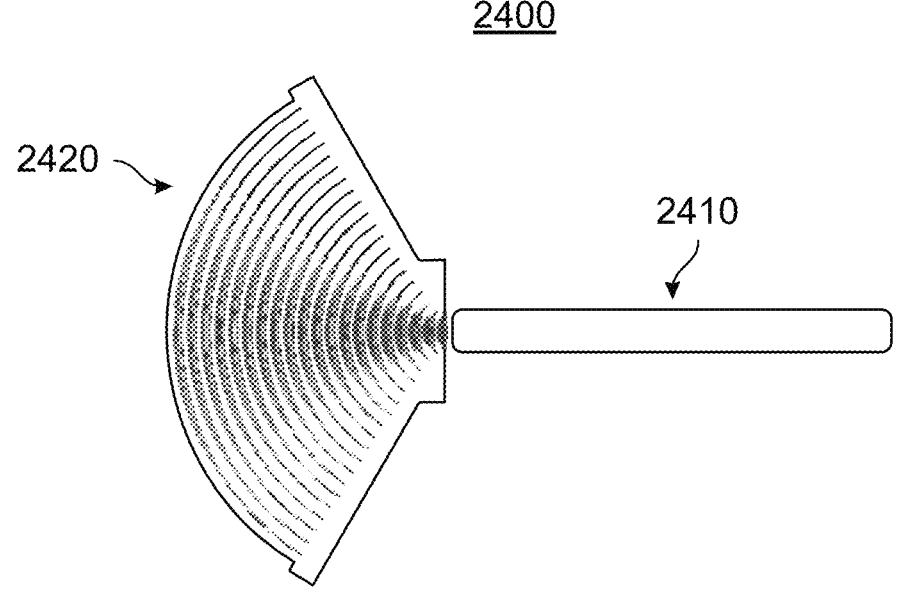
FIG. 24 illustrates a reconfigurable metasurface device in accordance with one or more embodiments of the present invention that includes a waveguide.

FIG. 24 illustrates yet another embodiment in which the reconfigurable metasurface device 2400 employs an optical waveguide 2410. By employing an optical waveguide, the intensity of the SAW is increased as its energy is more confined than in the broader reconfigurable metasurface device 100 illustrated in FIG. 1. To confine the SAW more efficiently to the optical waveguide 2410, the reconfigurable metasurface device 2400 employs a focusing IDT 2420, with arced fingers such that the generated SAW is focused on the end of the optical waveguide 2410. Relative to the reconfigurable metasurface device 100, the optical waveguide 2410 is formed of the thin film semiconductor layer 130. In this case, the optical signal will not be normal to the reconfigurable metasurface as illustrated in FIGS. 11A and 11B, but will instead be in the plane of the reconfigurable metasurface. This optical waveguide embodiment of the reconfigurable metasurface device 2400 holds promise as an optical modulator at the telecommunications wavelengths of 1.3 μm to 1.6 μm, though the various embodiments of the reconfigurable metasurface device are anticipated to operate from the near infrared (NIR) through the long wavelength infrared (LWIR), resulting in an operating wavelength range between approximately 1.0 μm and approximately 12.0 μm.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A reconfigurable metasurface device comprising:
   a piezoelectric substrate;
   at least one interdigitated transducer (IDT), the at least one IDT located on the piezoelectric substrate, the at least one IDT adapted to receive a radio frequency (RF) input signal and to generate a surface acoustic wave (SAW) in the piezoelectric substrate in response to the RF input signal received; and
   a thin film semiconductor layer, the thin film semiconductor layer located on the piezoelectric substrate adjacent the at least one IDT, the thin film semiconductor layer adapted to form a charge carrier pattern in response to the SAW in the piezoelectric substrate, the thin film semiconductor layer adapted to create plasmons in response to the charge carrier pattern.

2. The reconfigurable metasurface device of claim 1, wherein the piezoelectric substrate includes a piezoelectric layer, the piezoelectric layer including one of lithium niobate ($LiNbO_3$), aluminum nitride (AlN), or scandium aluminum nitride (ScAlN).

3. The reconfigurable metasurface device of claim 2, wherein the piezoelectric substrate further includes a cavity formed below at least a portion of the piezoelectric layer.

4. The reconfigurable metasurface device of claim 1, wherein the at least one IDT includes two IDTs, a first of the two IDTs adjacent a first edge of the thin film semiconductor layer, a second of the two IDTs adjacent a second edge of the thin film semiconductor layer opposite the first edge, each of the two IDTs adapted to receive a corresponding RF signal, the two IDTs adapted to generate a standing SAW in the piezoelectric substrate in response to the corresponding RF signal received.

5. The reconfigurable metasurface device of claim 1, wherein the at least one IDT includes two IDTs, a first of the two IDTs adjacent a first edge of the thin film semiconductor layer, a second of the two IDTs adjacent a second edge of the thin film semiconductor layer opposite the first edge, a first of the two IDTs adapted to receive a corresponding RF signal, the first of the two IDTs adapted to generate a standing SAW in the piezoelectric substrate in response to the corresponding RF signal received, a second of the two IDTs adapted to act as a reflector for the standing SAW.

6. The reconfigurable metasurface device of claim 1, wherein the at least one IDT includes two IDTs, a first of the two IDTs adjacent a first edge of the thin film semiconductor layer, a second of the two IDTs adjacent a second edge of the thin film semiconductor layer orthogonal to the first edge, each of the two IDTs adapted to receive a corresponding RF signal, each of the two IDTs adapted to generate a corresponding SAW in the piezoelectric substrate in response to the corresponding RF signal received.

7. The reconfigurable metasurface device of claim 1,
wherein the at least one IDT includes four IDTs;
wherein a first of the four IDTs is adjacent a first edge of the thin film semiconductor layer, a second of the four IDTs is adjacent a second edge of the thin film semiconductor layer opposite the first edge, each of the first and second of the four IDTs adapted to receive a corresponding RF signal, the first and second of the four IDTs adapted to generate a first standing SAW in the piezoelectric substrate in a first direction in response to the corresponding RF signal received; and
wherein a third of the four IDTs is adjacent a third edge of the thin film semiconductor layer orthogonal to the first edge, a fourth of the four IDTs is adjacent a fourth edge of the thin film semiconductor layer opposite the third edge, each of the third and fourth of the four IDTs adapted to receive a corresponding RF signal, the third and fourth IDTs adapted to generate a second standing SAW in the piezoelectric substrate in a second direction orthogonal to the first direction in response the corresponding RF signal received.

8. The reconfigurable metasurface device of claim 1,
wherein the at least one IDT includes four IDTs;
wherein a first of the four IDTs is adjacent a first edge of the thin film semiconductor layer, a second of the four IDTs is adjacent a second edge of the thin film semiconductor layer opposite the first edge, the first IDT adapted to receive a first RF signal, the first IDT adapted to generate a first standing SAW in the piezoelectric substrate in a first direction in response to the first RF signal received, the second IDT adapted to act as a reflector for the first standing SAW; and wherein a third of the four IDTs is adjacent a third edge of the thin film semiconductor layer orthogonal to the first edge, a fourth of the four IDTs is adjacent a fourth edge of the thin film semiconductor layer opposite the third edge, the third IDT adapted to receive a second RF signal, the third IDT adapted to generate a second standing SAW in the piezoelectric substrate in a second direction orthogonal to the first direction in response to the second RF signal received, the fourth IDT adapted to act as a reflector for the second standing SAW.

9. The reconfigurable metasurface device of claim 1, wherein the at least one IDT includes N pairs of IDTs; and wherein a first of each corresponding pair of the N pairs of IDTs is adjacent an edge of the thin film semiconductor layer, and a second of each corresponding pair of the N pairs of IDTs is adjacent an edge of the thin film semiconductor layer opposite the first of each corresponding pair of the N pairs of IDTs.

10. The reconfigurable metasurface device of claim 1, wherein each of the at least one IDTs is a chirped IDT.

11. The reconfigurable metasurface device of claim 1, wherein the thin film semiconductor layer includes one of graphene, twisted bilayer graphene, gallium arsenide (GaAs), or indium gallium arsenide (InGaAs).

12. The reconfigurable metasurface device of claim 1, wherein the thin film semiconductor layer includes a waveguide, the waveguide adapted to carry an optical signal.

13. The reconfigurable metasurface device of claim 12, wherein each of the at least one IDT is a focusing IDT adapted to generate a SAW in the piezoelectric substrate below the waveguide.

14. The reconfigurable metasurface device of claim 1 further comprising two bias electrodes, the two bias electrodes located on the thin film semiconductor layer, a first of the two bias electrodes adjacent a first edge of the thin film semiconductor layer, a second of the two bias electrodes adjacent a second edge of the thin film semiconductor layer opposite the first edge, the two bias electrodes adapted to be in ohmic electrical contact with the thin film semiconductor layer, the two bias electrodes adapted to receive a bias voltage and to cause a current to flow in the thin film semiconductor layer.

15. The reconfigurable metasurface device of claim 14, wherein each of the two bias electrodes includes at least one of titanium (Ti), gold (Au), or silver (Ag).

16. The reconfigurable metasurface device of claim 1, wherein the thin film semiconductor layer is adapted to receive an optical signal and to reflect a first portion of the optical signal, to transmit a second portion of the optical signal, and to absorb a third portion of the optical signal.

17. The reconfigurable metasurface device of claim 16 further comprising a reflector, the reflector formed on a side of the piezoelectric substrate opposite the thin film semiconductor layer, the reflector adapted to reflect the optical signal.

18. The reconfigurable metasurface device of claim 1 further comprising a buffer layer, the buffer layer located between the piezoelectric substrate and the thin film semiconductor layer.

19. The reconfigurable metasurface device of claim 18, wherein the buffer layer includes one or more of aluminum arsenide (AlAs), aluminum nitride AlN, barium fluoride ($BaF2$), beryllium oxide (BeO), calcium oxide (CaO), hafnium oxide ($HfO2$), gallium arsenide (GaAs), gallium nitride (GaN), gallium phosphide (GaP), indium arsenide (InAs), indium phosphide (InP), indium antimonide (InSb), magnesium oxide (MgO), manganese oxide (MnO), nickel oxide (NiO), lead zirconium titanate (PZT), silicon carbide (SiC), silicon nitride (Si3N4), or silicon oxide (SiO2).

20. The reconfigurable metasurface device of claim 1, wherein the reconfigurable metasurface device is adapted to function as one of an RF amplifier, a one-dimensional reconfigurable metasurface device, a two-dimensional metasurface device, or an optical modulator.

* * * * *